(12) United States Patent
Fain et al.

(10) Patent No.: US 10,983,082 B2
(45) Date of Patent: Apr. 20, 2021

(54) MEASUREMENT DEVICE COMPRISING A SUSPENDED SEMICONDUCTOR WIRE

(71) Applicants: Commissariat à l'Energie Atomique et aux Energies Alternatives, Paris (FR); SAFRAN, Paris (FR)

(72) Inventors: Bruno Fain, Grenoble (FR); Guillaume Jourdan, Grenoble (FR); Guillaume Lehee, Grenoble (FR)

(73) Assignees: COMMISSARIAT À L'ENERGIE ATOMIQUE ET AUX ENERGIES ALTERNATIVES, Paris (FR); SAFRAN, Paris (FR)

( * ) Notice: Subject to any disclaimer, the term of this patent is extended or adjusted under 35 U.S.C. 154(b) by 12 days.

(21) Appl. No.: 16/576,543

(22) Filed: Sep. 19, 2019

(65) Prior Publication Data

US 2020/0096468 A1 Mar. 26, 2020

(30) Foreign Application Priority Data

Sep. 21, 2018 (FR) ...................................... 1858604

(51) Int. Cl.
*G01N 27/22* (2006.01)
*H01L 23/00* (2006.01)
*H01L 21/48* (2006.01)

(52) U.S. Cl.
CPC .......... *G01N 27/227* (2013.01); *H01L 24/48* (2013.01); *H01L 21/4825* (2013.01)

(58) Field of Classification Search
CPC ...... B81B 1/00–008; B81B 3/00–0097; B81B 5/00; B81B 7/00–04; B81B 2201/00–13; B81B 2203/00–06; B81B 2207/00–99
See application file for complete search history.

(56) References Cited

U.S. PATENT DOCUMENTS

| | | | |
|---|---|---|---|
| 5,861,556 A | 1/1999 | Nukui et al. | |
| 9,643,179 B1* | 5/2017 | Engelmann | B01L 3/502761 |
| 2004/0175856 A1* | 9/2004 | Jaiprakash | B82Y 40/00 438/52 |
| 2006/0109075 A1* | 5/2006 | Cabal | H01H 61/02 337/333 |
| 2008/0224717 A1* | 9/2008 | Kim | B81B 3/0021 324/691 |
| 2010/0219489 A1* | 9/2010 | Duraffourg | B81B 3/0086 257/416 |
| 2014/0021443 A1* | 1/2014 | Yu | B81C 1/00134 257/24 |
| 2015/0175413 A1* | 6/2015 | Boland | B81C 1/00968 307/131 |

(Continued)

OTHER PUBLICATIONS

Preliminary Search Report for French Patent Application No. FR1858604 dated May 15, 2019, 2 pages.

(Continued)

*Primary Examiner* — Jonathan Han
(74) *Attorney, Agent, or Firm* — Moreno IP Law LLC

(57) ABSTRACT

The invention relates to a measurement device comprising a suspended semiconductor wire, a first control circuit designed to apply and/or read a first electrical signal between first and second ends of the suspended semiconductor wire and a second control circuit designed to apply and/or read a second electrical signal between first and second intermediate nodes of the suspended semiconductor wire.

14 Claims, 10 Drawing Sheets

(56) References Cited

U.S. PATENT DOCUMENTS

2015/0241291 A1* 8/2015 Riou .................... G01L 9/0052
73/702

OTHER PUBLICATIONS

Wikipedia: "Four-terminal sensing", Wikipedia, Sep. 16, 2018 (Sep. 16, 2018), pp. 1-3, XP055772992, Obtained from the Internet: URL:https://en.wikipedia.org/w/index.php?title=Four-terminal_sensing&oldid=859823801.

* cited by examiner

MEASUREMENT DEVICE COMPRISING A SUSPENDED SEMICONDUCTOR WIRE

FIELD

The present disclosure relates to the field of measurement devices based on suspended semiconductor wires.

BACKGROUND

Measurement devices have already been proposed in which a suspended semiconductor nanowire or microwire is used for the measurement of a physical variable that is characteristic of the environment of the wire, for example the temperature in the vicinity of the wire, the thermal conductivity and/or the pressure of a gas in contact with the wire, a mechanical deformation, etc.

In these devices, the semiconductor wire plays the role of a resistive transducer. In other words, the variations in the physical variable to be measured are expressed by variations in the electrical resistance of the wire. The measurement device comprises a control circuit adapted to measure variations in the electrical resistance of the wire and to deduce therefrom variations in the physical variable to be measured.

It would be desirable to be able to at least partly improve certain aspects of known measurement devices based on suspended semiconductor wires.

SUMMARY

Thus, one embodiment provides a measurement device comprising:
a suspended semiconductor wire;
a first control circuit designed to apply and/or read a first electrical signal between first and second ends of the suspended semiconductor wire; and
a second control circuit designed to apply and/or read a second electrical signal between first and second intermediate nodes of the suspended semiconductor wire.

According to an embodiment, the first and second ends of the suspended semiconductor wire are respectively fixed to first and second semiconducting anchoring areas, the device comprising a first conductive terminal on and in contact with the first anchoring area and a second conductive terminal on and in contact with the second anchoring area, and the first control circuit being connected to the first and second conductive terminals.

According to an embodiment, the first and second anchoring areas respectively lie on first and second support pillars.

According to an embodiment, the device further comprises a first probe wire made of a semiconductor material, coupling the first intermediate node of the suspended semiconductor wire to a third conductive terminal, and a second probe wire made of a semiconductor material, coupling the second intermediate node of the suspended semiconductor wire to a fourth conductive terminal, the second control circuit being connected to the third and fourth conductive terminals.

According to an embodiment:
the first probe wire has a first end fixed to the first suspended semiconductor wire at its first intermediate node and a second end fixed to a third semiconducting anchoring area;
the second probe wire has a first end fixed to the first suspended semiconductor wire at its second intermediate node and a second end fixed to a fourth semiconducting anchoring area; and
the third and fourth conductive terminals are respectively on and in contact with the third anchoring area and on and in contact with the fourth anchoring area.

According to an embodiment, the third and fourth anchoring areas respectively lie on third and fourth support pillars so that the first probe wire is suspended between the third support pillar and the first intermediate node of the suspended semiconductor wire and so that the second probe wire is suspended between the fourth support pillar and the second intermediate node of the suspended semiconductor wire.

According to an embodiment, the width of the first suspended semiconductor wire varies along the longitudinal axis of the wire so that, during operation, the temperature between the first and second intermediate nodes of the suspended semiconductor wire is substantially uniform.

According to an embodiment, the device comprises a plurality of suspended semiconductor wires that are interconnected so as to form a suspended semiconducting grid.

According to an embodiment, the density of suspended semiconductor wires of the grid varies along a longitudinal axis of the grid.

According to an embodiment, the first control circuit is configured to apply a bias current between the first and second ends of the suspended semiconductor wire, and the second control circuit is configured to measure the voltage between the first and second intermediate nodes of the suspended semiconductor wire.

According to an embodiment, the second measurement circuit comprises a first voltage measurement amplifier having a first measurement terminal coupled to the first intermediate node of the suspended semiconductor wire and a second measurement terminal coupled to the second intermediate node of the suspended semiconductor wire, the first voltage measurement amplifier further comprising an output terminal coupled to the first end of the suspended semiconductor wire by a first resistor.

According to an embodiment, the device further comprises a second voltage measurement amplifier and a voltage adder, and:
the second voltage measurement amplifier has first and second measurement terminals coupled respectively to first and second ends of a second resistor connected in series with the suspended semiconductor wire;
the voltage adder has first and second input terminals coupled respectively to the output terminal of the first amplifier and to an output terminal of the second amplifier; and
the voltage adder comprises an output terminal coupled to the first end of the suspended semiconductor wire by the first resistor.

According to an embodiment, during operation, a first part of the bias current flows in the suspended semiconductor wire and a second part of the bias current is deviated by the first resistor, the values of the first and second parts of the bias current being a function of the value of the voltage on the end of the first resistor opposite the first end of the suspended semiconductor wire.

According to an embodiment, the bias current provided by the first control circuit is chosen so that there are two stable bias states of the device, i.e. two possible distributions of the bias current between the suspended semiconductor wire and the first resistor.

According to an embodiment, the second control circuit is configured to detect an abrupt change in the bias state of the device, corresponding to a crossing of a threshold by a physical variable characteristic of the environment of the semiconductor wire.

According to an embodiment, the first control circuit is configured to provide a periodically variable bias current.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures and, in addition, the various figures are not drawn to scale. For the sake of clarity, only the elements that are useful for an understanding of the described embodiments herein have been illustrated and described in detail. In particular, the potential various applications of the described measurement devices have not been described in detail, the described embodiments potentially being advantageously used in all or the majority of the measurement applications that use the electrical response of a suspended semiconductor wire for measuring variations in a physical variable characteristic of the environment of the wire. In addition, the described devices can be used for the characterization of semiconductor wires, in particular during the design of sensors based on suspended semiconductor wires. In the following disclosure, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, it being understood that, in practice, the described devices can have a different orientation. Unless specified otherwise, the expressions "approximately", "substantially" and "in the order of" signify within 10%, and preferably within 5%.

The present application relates more specifically to measurement devices based on suspended semiconductor nanowires or microwires, for example wires the maximum size of which, in the cross section (orthogonally to the longitudinal direction of the wire), is less than 10 µm, preferably less than 1 µm, preferably less than 500 nm. For the sake of simplicity, the term wire will be used in the following description to designate such nanowires or microwires. In the present disclosure, the term wire generally designates any elongated element, i.e. the length of which (i.e. its greatest dimension) is significantly greater, for example at least twice as great, preferably at least five times as great, preferably at least ten times as great, than its greatest width, i.e. than its maximum size in the cross section (in a plane orthogonal to the longitudinal axis of the wire). In the described devices, the width of the wires can be constant along the longitudinal axis of the wire, or variable along the longitudinal axis of the wire.

Figure 1:
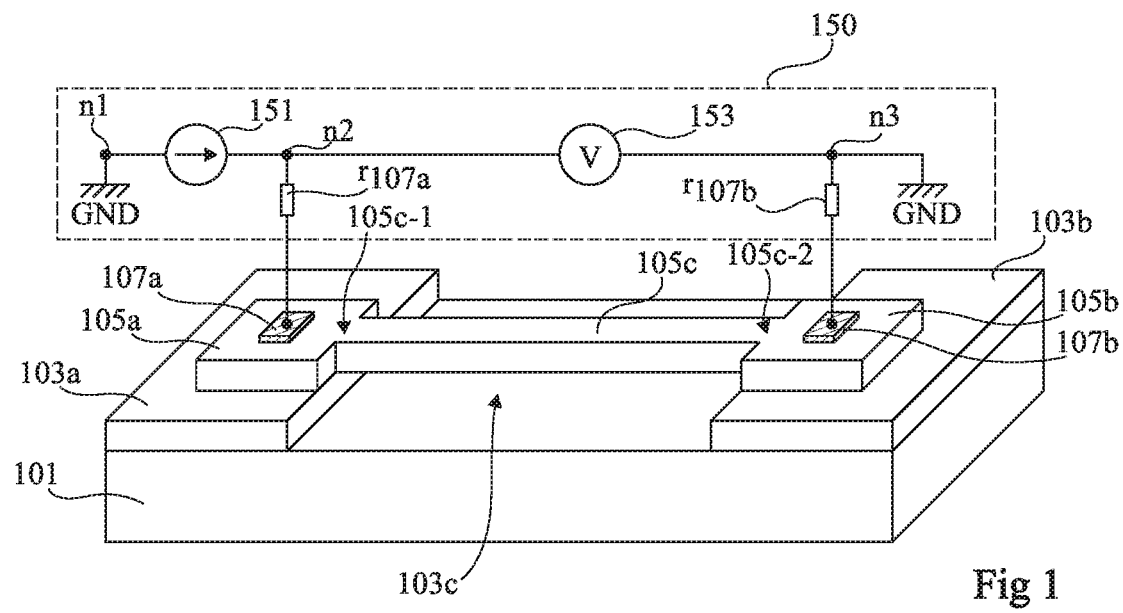
FIG. 1 is a perspective view depicting in a schematic fashion an example of a measurement device comprising a suspended semiconductor wire.

FIG. 1 is a perspective view depicting in a schematic fashion an example of a measurement device comprising a suspended semiconductor wire.

The device shown in FIG. 1 comprises a support substrate 101, for example made of a semiconductor material, for example made of silicon. The device shown in FIG. 1 further comprises, on the upper face of the substrate 101, for example in contact with the upper face of the substrate 101, two pillars or pads 103a and 103b, for example made of an insulating material, for example made of silicon oxide. The pillars 103a and 103b are separated laterally by an area 103c free of any solid material. The device shown in FIG. 1 further comprises a wire 105c made of a semiconductor material, for example made of silicon, suspended between the pillars 103a and 103b above the area 103c. In the illustrated example, the longitudinal axis of the wire 105c is substantially parallel to the upper face of the substrate 101. The transversal dimension of the wire (orthogonal to the longitudinal axis of the wire) parallel to the upper face of the substrate 101 will be called width of the wire here, and the transversal dimension of the wire orthogonal to the upper face of the substrate 101 will be called the thickness of the wire. In the illustrated example, the thickness and the width of the wire are substantially constant along the entire length of the wire. The wire 105c is fixed, on the side of a first end 105c-1, to the upper face of the pillar 103a, and, on the side of a second end 105c-2, to the upper face of the pillar 103b. In the illustrated example, on the side of its first end 105c-1, the wire 105c is extended by an anchoring area 105a, for example made of the same material as the wire 105c, the lower face of which lies on the upper face of the pillar 103a, for example in contact with the upper face of the pillar 103a. In addition, in this example, on the side of its second end 105c-2, the wire 105c is extended by an anchoring area 105b, for example made of the same material as the wire 105c, the lower face of which lies on the upper face of the pillar 103b, for example in contact with the upper face of the pillar 103b. The device shown in FIG. 1 additionally comprises a metallized contact 107a, on and in contact with the upper face of the anchoring area 105a, and a metallized contact 107b on and in contact with the upper face of the anchoring area 105b. By means of the metallized contacts 107a and 107b, it is possible to apply and/or read an electrical signal between the ends of the wire 105c.

The measurement device shown in FIG. 1 further comprises a control circuit 150 connected, on one side, to the metallized contact 107a and, on the other, to the metallized contact 107b, adapted to apply and/or read an electrical signal between the ends of the wire 105c. More specifically, in this example, the control circuit 150 is adapted to make an electric current flow in the wire 105c, between its first and second ends, and to measure a voltage between the first and second ends of the wire. For this purpose, in the illustrated example, the control circuit 150 comprises a current source 151 and a voltage sensor 153. The current source 151 is connected in series with the wire 105c, and the voltage sensor 153 is connected in parallel with the wire 105c. More specifically, in the illustrated example, the current source 151 comprises a first conduction terminal connected to a node n1 of the circuit 150 and a second conduction terminal connected to a node n2 of the circuit 150, and the voltage sensor 153 comprises a first measurement terminal connected to the node n2 and a second measurement terminal connected to a node n3 of the circuit 150. In the diagram shown in FIG. 1, access resistors r107a and r107b have been illustrated. The resistor r107a couples the node n2 to the metallized contact 107a and the resistor r107b couples the node n3 to the metallized contact 107b. The resistors r107a and r107b correspond to the parasitic access resistances of the control circuit 150, comprising in particular the resistances of the conductive tracks for connecting the control circuit to the semiconductor wire 105c. The nodes n1 and n3 are, for example, coupled to an application node GND for applying a reference potential of the measurement device, for example ground.

For instance, during operation, the control circuit 150 can apply a given current in the semiconductor wire 105c, and measure the voltage resulting at the terminals of the wire. The control circuit 150 can thus measure resistance variations of the wire 105c, and deduce therefrom variations in a physical variable characteristic of the environment of the wire.

The semiconductor wires are especially advantageous in measurement devices measuring by resistance transduction. In particular, due to their small size and particular effects in the semiconductor material constituting the same, linked to their micrometric or nanometric dimensions, it is possible to achieve particularly high measurement sensitivities, with a high integration density.

Nevertheless, the use of such semiconductor wires for effecting measurements requires a good control of their electrical response. In particular, certain properties of the semiconductor material constituting the wire, such as its electrical resistivity and its thermal conductivity, are generally highly dependent on temperature, which in turn depends on the conditions of electrical bias of the wire. Indeed, the small dimensions of the wire induce significant self-heating by Joule effect when the wire is biased. This self-heating is, moreover, not uniform in the wire. In particular, the self-heating of the wire as a result of its electrical bias is generally greater in a central section of the wire than in the vicinity of the anchoring areas of the wire (the anchoring areas behaving as thermal dissipaters limiting the elevation of the temperature of the wire in the vicinity of its ends). In addition, property variations of the semiconductor material as a function of temperature can lead to an amplification of the self-heating phenomenon in a manner that is sometimes difficult to predict.

In practice, the electrical response of the wire can have a highly non-linear, or non-monotonic, behavior. This behavior can be explained in particular by the change in conduction regime in the semiconductor material constituting the wire when the temperature varies. More specifically, when the temperature of the semiconductor material is relatively low, the electrical conduction regime in the material is a so-called extrinsic conduction regime, i.e. the electric conductivity is essentially linked to the concentration of dopants in the material. When the temperature of the semiconductor material increases, the extrinsic conduction regime is replaced by an intrinsic conduction regime, i.e. in which electrical conductivity is substantially independent of the concentration in dopants in the material. In practice, this change in conduction regime occurs in the hottest zones of the semiconductor wire, generally in the middle of the wire, then the zone of intrinsic conduction gradually extends in the direction of the ends of the wire when the temperature of the wire increases. Certain portions of the wire, in particular in the vicinity of the ends of the wire, may constantly remain relatively cold (as a result of the thermal losses via the anchoring areas), so that these zones always retain an extrinsic conduction regime.

A limitation of the measurement device shown in FIG. 1 is that the current source 151 and the voltage sensor 153 are electrically coupled to the end 105c-1 of the semiconductor wire 105c by a same metallized contact 107a and are electrically coupled to the end 105c-2 of the wire by a same metallized contact 107b. This simplifies the design and the implementation of the measurement device. However, the measurement of the resistance of the wire 105c implemented by the control circuit 150 thus integrates the access resistors r107a and r107b in series with the wire 105c. This leads to a limitation of the precision and temperature sensitivity of the measurement device. In addition, the performed measurement gives a global indication regarding the electrical resistance of the wire, which does not take into account local variations in the behavior of the wire along its longitudinal axis (linked to the variations in temperature of the wire along its longitudinal axis).

Figure 2:
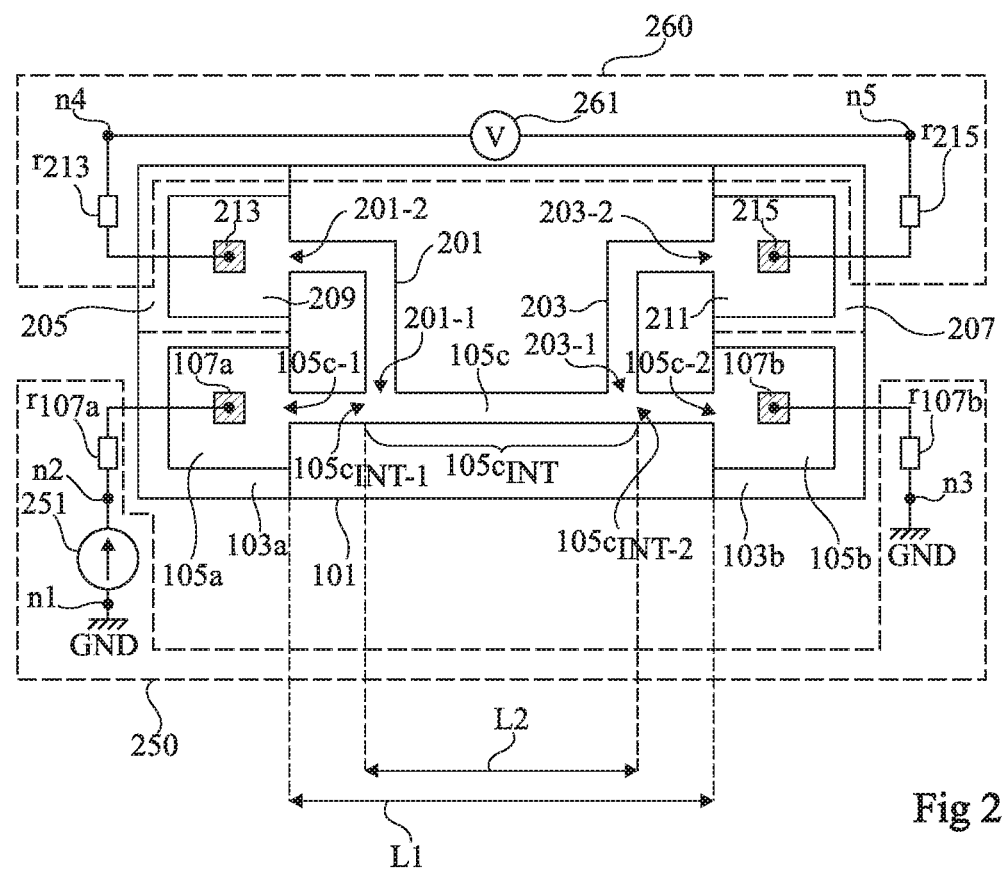
FIG. 2 is a top view depicting in a schematic fashion an example of an embodiment of a measurement device comprising a suspended semiconductor wire.

FIG. 2 is a top view depicting in a schematic fashion an example embodiment of a measurement device comprising a suspended semiconductor wire. The measurement device shown in FIG. 2 comprises elements in common with the measurement device shown in FIG. 1. These elements will not be described again in detail in the following. In the following, only the differences with the measurement device shown in FIG. 1 will be highlighted.

The device shown in FIG. 2 comprises, as in the example shown in FIG. 1, a suspended semiconductor wire 105c between two pillars 103a and 103b above a support substrate 101. As in the example shown in FIG. 1, the wire 105c is fixed, by its first end 105c-1, to an anchoring area 105a lying on the pillar 103a, and, by its second end 105c-2, to an anchoring area 105b lying on the pillar 103b. In addition, as in the example shown in FIG. 1, the device comprises a metallized contact 107a, on and in contact with the upper face of the anchoring area 105a, and a metallized contact 107b on and in contact with the upper face of the anchoring area 105b.

The device shown in FIG. 2 further comprises a first control circuit 250 connected, on one side, to the metallized contact 107a and, on the other, to the metallized contact 107b, adapted to apply and/or read an electrical signal between the ends of the wire 105c. More specifically, in this example, the control circuit 150 is adapted to make an electric current flow in the wire 105c, between its ends 105c-1 and 105c-2. For this purpose, in the illustrated example, the control circuit 250 comprises a current source 251 connected in series with the wire 105c. More specifically, in the illustrated example, the current source 251 comprises a first conduction terminal connected to a node n1 of the circuit 250 and a second conduction terminal connected to a node n2 of the circuit 250. In the diagram shown in FIG. 2, access resistors r107a and r107b have been illustrated. The resistor r107a couples the node n2 to the metallized contact 107a and the resistor r107b couples the metallized contact 107b to a node n3 of the circuit 250. The resistors r107a and r107b correspond to the parasitic access resistances of the control circuit 250, comprising in particular the resistances of the conductive tracks for connecting the control circuit 250 to the semiconductor wire 105c. The nodes n1 and n3 are, for example, connected. In the illustrated example, the nodes n1 and n3 are, for example, coupled to a same application node GND for applying a reference measurement potential, for example ground.

The device shown in FIG. 2 further comprises a second control circuit 260 designed to apply and/or read a second electrical signal at the terminals of an intermediate section $105c_{INT}$ of the semiconductor wire 105c, located between the ends 105c-1 and 105c-2 of the wire. The length L2 of the intermediate section $105c_{INT}$ of the wire 105c is less than the length L1 of the wire 105c, for example comprised between 0.2 and 0.8 times the length L1. The section 105cINT extends between a first intermediate node $105c_{INT\text{-}1}$ of the wire 105c, located between the ends 105c-1 and 105c-2 of the wire, and a second intermediate node $105c_{INT\text{-}2}$ of the wire 105c, located between the node $105c_{INT\text{-}1}$ and the end 105c-2 of the wire. The intermediate section $105c_{INT}$ is, for example, centered in the middle of the wire 105c, i.e. the distance between the end $105c_{INT\text{-}1}$ of the intermediate section $105c_{INT}$ and the end 105c-1 of the wire 105c is substantially equal to the distance between the end $105c_{INT\text{-}2}$ of the section $105c_{INT}$ and the end 105c-2 of the wire 105c.

In the example shown in FIG. 2, the measurement device comprises two additional suspended semiconductor wires or probe wires 201 and 203, separate from the wire 105c, respectively coupling the first end $105c_{INT\text{-}1}$ of the intermediate section $105c_{INT}$ of the wire 105c to a first terminal of the control circuit 260, and the second end $105c_{INT\text{-}2}$ of the intermediate section $105c_{INT}$ of the wire 105c to a second terminal of the control circuit 260. The probe wires 201 and 203 are, for example, made of the same semiconductor material as the wire 105c.

The semiconductor wire 201 is suspended above the substrate 101, parallel to the upper face of the substrate 101, between the end $105c_{INT\text{-}1}$ of the intermediate section $105c_{INT}$ of the wire 105c and a pillar or pad 205, for example made of an insulating material, for example made of silicon oxide, disposed on the upper face of the substrate 101, for example in contact with the upper face of the substrate 101. In the illustrated example, the pillar 205 and the pillar 103a are juxtaposed. The wire 201 has a first end 201-1 mechanically and electrically in contact with the wire 105c at the intermediate node $105c_{INT\text{-}1}$ of the wire 105c. More specifically, in this example, the semiconductor wire 201 constitutes a deviation of the wire 105c, leaving the wire 105c at the intermediate node $105c_{INT\text{-}1}$. On the side of a second end 201-2, the wire 201 is fixed to the upper face of the pillar 205. More specifically, in this example, on the side of its end 201-2, the wire 201 is extended by an anchoring area 209 separate (and disjunct) from the anchoring area 105a, for example made of the same material as the wire 201, the lower face of which lies on the upper surface of the pillar 205, for example in contact with the upper face of the pillar 205.

The semiconductor wire 203 is suspended above the substrate 101, parallel to the upper face of the substrate 101, between the end $105c_{INT\text{-}2}$ of the intermediate section $105c_{INT}$ of the wire 105c and a pillar or pad 207, for example made of an insulating material, for example made of silicon oxide, disposed on the upper face of the substrate 101, for example in contact with the upper face of the substrate 101. In the illustrated example, the pillar 207 and the pillar 103b are juxtaposed. The wire 203 has a first end 201-1 mechanically and electrically in contact with the wire 105c at the intermediate node $105c_{INT\text{-}2}$ of the wire 105c. More specifically, in this example, the semiconductor wire 203 constitutes a deviation of the wire 105c, leaving the wire 105c at the intermediate node $105c_{INT\text{-}2}$. On the side of a second end 203-2, the wire 201 is fixed to the upper face of the pillar 207. More specifically, in this example, on the side of its end 203-2, the wire 203 is extended by an anchoring area 211 separate (and disjunct) from the anchoring area 105b, for example made of the same material as the wire 203, the lower face of which lies on the upper surface of the pillar 207, for example in contact with the upper face of the pillar 207.

The device shown in FIG. 2 additionally comprises a metallized contact 213, on and in contact with the upper face of the anchoring area 209, and a metallized contact 215 on and in contact with the upper face of the anchoring area 211. By means of the metallized contacts 213 and 215, it is possible to apply and/or read an electrical signal between the intermediate nodes 105cINT-1 and 105cINT-2 of the wire 105c, by way of the semiconductor wires 201 and 203.

In the example shown in FIG. 2, the control circuit 260 is connected on one side to the metallized contact 213 and on the other to the metallized contact 215. The control circuit is adapted to apply and/or measure an electrical signal between the metallized contacts 213 and 215, i.e. at the terminals of the association in series of the wire 201, the intermediate section 105cINT of the wire 105c, and the wire 203. More specifically, in this example, the control circuit 260 is adapted to measure the voltage between the metallized contacts 213 and 215 of the device. For this purpose, the control circuit 260 comprises a voltage sensor 261, for example a voltmeter, having a first measurement terminal connected to a node n4 of the circuit 260 and a second measurement terminal connected to a node n5 of the circuit 260. In the diagram shown in FIG. 2, access resistors r213 and r215 have been illustrated. The resistor r213 couples the node n4 to the metallized contact 213 and the resistor r215 couples the node n5 to the metallized contact 215. The resistors r213 and r215 correspond to the parasitic access resistances of the control circuit 260, comprising in particular the resistances of the conductive tracks for connecting the control circuit to the end 201-2 of the semiconductor wire 201 and to the end 203-2 of the semiconductor wire 203.

For instance, during operation, the control circuit 250 applies a given current in the semiconductor wire 105c, and thus in the intermediate section $105c_{INT}$ of the wire 105c, and the control circuit 260 measures the resulting voltage at the terminals of the intermediate section $105c_{INT}$ (by way of the semiconductor probe wires 201 and 203). By means of the control circuits 250 and 260, it is thus possible to measure variations in resistance of the intermediate section $105c_{INT}$ of the wire 105c, and deduce therefrom variations in a physical variable characteristic of the environment of the wire. For instance, the measurement device shown in FIG. 2 can comprise a processing and control unit, not illustrated, configured to control the control circuits 250 and 260 and read and process the signals measured by the control circuit 250 and/or by the control circuit 260.

An advantage of the measurement device shown in FIG. 2 is that it makes it possible to measure variations in resistivity of the intermediate section $105c_{INT}$ of the semiconductor wire 105c, independently of the variations in resistivity in the vicinity of the ends of the wire (i.e. between the end 105c-1 and the intermediate node $105c_{INT-1}$ of the wire 105c and between the end 105c-2 and the intermediate node $105c_{INT-2}$ of the wire 105c). By this means, it is possible to improve the precision and the sensitivity of the measurement device. In particular, the temperature profile of the intermediate section $105c_{INT}$ of the wire 105c can be controlled with precision by the choice of the electrical bias conditions. More specifically, for a given bias current, the temperature of the intermediate section $105c_{INT}$ of the wire 105c can be considerably more uniform than the temperature of the complete wire 105c, and the average temperature of the intermediate section $105c_{INT}$ of the wire 105c can be markedly higher than the average temperature of the complete wire 105c. Thus, the variations in the physical variable that one wishes to measure can be deduced with great precision from the variations in the resistance of the intermediate section $105c_{INT}$ of the wire 105c. It is in particular possible to provide a bias of the wire 105c so that variations in the physical variable that one wishes to measure lead to a change in the conduction regime in the intermediate section $105c_{INT}$ of the wire 105c, which makes it possible to detect said variations particularly efficiently.

Figure 3A:
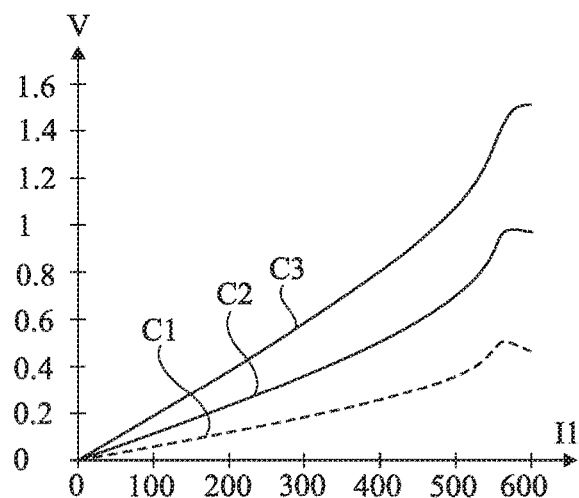
FIGS. 3A and 3B are graphs depicting the electrical response of a suspended semiconductor wire of a measurement device of the type described in relation to FIG. 2.
Figure 3B:
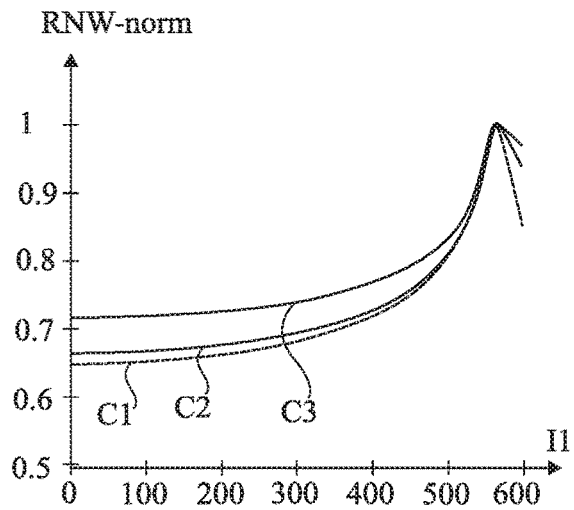

FIGS. 3A et 3B are graphs depicting the operation of the measurement device shown in FIG. 2. More specifically, FIG. 3A illustrates the progression, as a function of the bias current I1 (in the abscissa, in microamperes) applied in the wire 105c by the control device 250, of the voltage V (in the ordinate, in volts) measured at the terminals of the intermediate section $105c_{INT}$ of the wire 105c by the control device 260. FIG. 3B is an equivalent graph illustrating the progression, as a function of the bias current I1 (in the abscissa, in microamperes) applied in the wire 105c by the monitor device 250, of the resistance $R_{NW-norm}$ of the intermediate section $105c_{INT}$ of the wire 105c, standardized with respect to its maximum value (in the ordinate, no unit). Each of the graphs of FIGS. 3A and 3B comprises three curves C1, C2 and C3. In each graph, the curve C1 corresponds to a first configuration of the measurement device, in which the length L2 of the intermediate section $105c_{INT}$ is equal to 0.31 times the length L1 of the wire 105c. The curve C2 corresponds to a second configuration of the measurement device, in which the length L2 of the intermediate section $105c_{INT}$ is equal to 0.61 times the length L1 of the wire 105c. The curve C3 corresponds to a third configuration of the measurement device or reference configuration, in which the length L2 of the intermediate section $105c_{INT}$ is equal to the length L1 of the wire 105c (which corresponds substantially to the configuration shown in FIG. 1). In each case, the ends $105c_{INT-1}$ and $105c_{INT-2}$ of the intermediate section $105c_{INT}$ are disposed in a symmetrical fashion with respect to the center of the wire 105c.

In FIGS. 3A and 3B, an inflection of the curve V(I1) or R(I1) can be observed when the bias current I1 reaches a certain threshold. This inflection corresponds to the passage from the extrinsic conduction regime to the intrinsic conduction regime in the intermediate section $105c_{INT}$ of the wire 105c, which results from the self-heating of the wire linked to the flow of the bias current in the wire. It can in particular be observed that the inflection is all the more pronounced the shorter the length L2 of the intermediate section $105c_{INT}$ with respect to the total length L1 of the wire 105c. This can be explained by the fact that the temperature of the intermediate section $105c_{INT}$ of the wire 105c is all the more homogeneous the shorter the length L2 of the intermediate section $105c_{INT}$ with respect to the total length L1 of the wire 105c, and that, consequently, the transition from the extrinsic conduction regime to the intrinsic conduction regime is all the more abrupt the shorter the length L2 of the intermediate section $105c_{INT}$ with respect to the total length L1 of the wire 105c. It can in particular be observed on the curves C1 and C2 that the slope of the curve V(I1) becomes negative when the bias current I1 exceeds a certain threshold, which is characteristic of a negative differential resistance.

Figure 4:
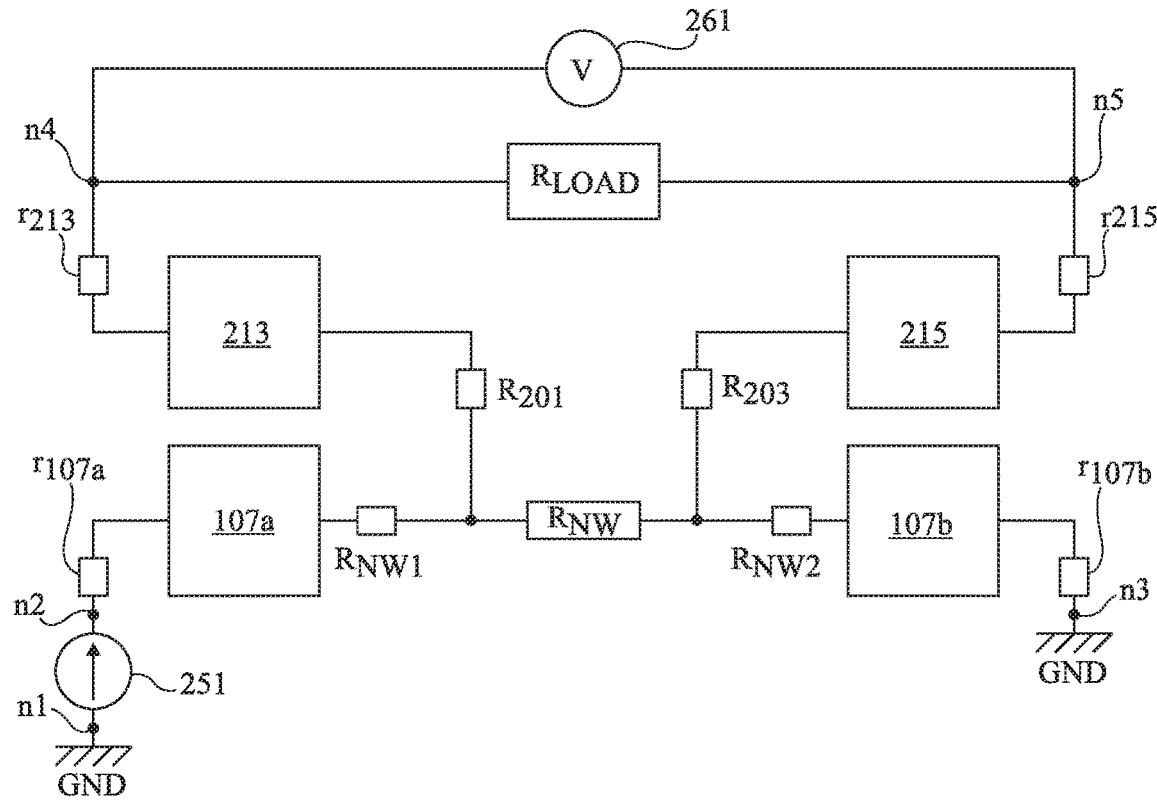
FIG. 4 is an equivalent circuit diagram of an example embodiment of a measurement device comprising a suspended semiconductor wire.

FIG. 4 is an equivalent circuit diagram depicting the measurement device shown in FIG. 2;

In FIG. 4, the metallized contacts 107a, 107b, 213 and 215 of the measurement device are illustrated schematically. Further illustrated are the current source 251, the access resistors r107a and r107b of the control circuit 250, the voltage sensor 261, and the access resistors r213 and r215 of the control circuit 260.

FIG. 4 outlines the semiconductor wire 105c via three resistors $R_{NW1}$, $R_{NW}$ and $R_{NW2}$ connected in series between the metallized contacts 107a and 107b. The resistor $R_{NW}$ corresponds to the resistance of the intermediate section $105c_{INT}$ of the wire 105c. The resistor $R_{NW1}$ corresponds to the resistance of the first lateral section of the wire 105c, extending between the end 105c-1 and the intermediate node $105c_{INT-1}$ of the wire 105c, and the resistor $R_{NW2}$ corresponds to the resistance of the second lateral section of the wire 105c, extending between the intermediate node $105c_{INT-2}$ and the end 105c-2 of the wire 105c.

FIG. 4 further illustrates a resistor $R_{201}$ coupling the middle point between the resistors $R_{NW1}$ and $R_{NW}$ to the metallized contact 213, corresponding to the resistance of the probe wire 201, and a resistor R203 coupling the middle point between the resistors $R_{NW}$ and $R_{NW2}$ to the metallized contact 215, corresponding to the resistance of the probe wire 203.

Moreover, FIG. 4 illustrates a resistor $R_{LOAD}$ coupling the node n4 to the node n5, corresponding to the impedance of the voltage measurement device 261.

Figure 5:
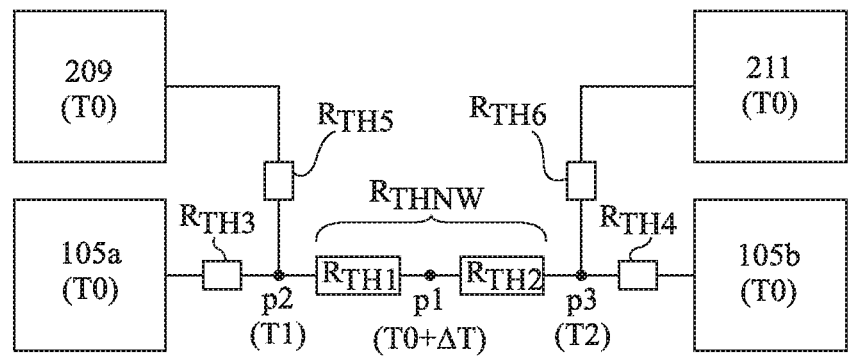
FIG. 5 is an equivalent thermal diagram of an example embodiment of a measurement device comprising a suspended semiconductor wire.

FIG. 5 is an equivalent thermal diagram depicting the measurement device shown in FIG. 2;

In FIG. 5, the anchoring areas 105a, 105b, 209 and 211 of the measurement device are illustrated schematically. In this example, the anchoring areas 105a, 105b, 209 and 211 are considered to be at a same temperature T0 and to form a thermal mass of the device.

FIG. 5 further illustrates a point p1 corresponding to the middle of the semiconductor wire 105c, a point p2 corresponding to the first end $105c_{INT-1}$ of the intermediate section $105c_{INT}$ of the wire 105c, and a point p3 corresponding to the second end $105c_{INT-2}$ of the intermediate section $105c_{INT}$ of the wire 105c. During operation, as a result of the bias current, the central point p1 of the wire 105c rises to a temperature T0+ΔT that is greater than the temperature T0. The point p2 rises for its part to a temperature T1 comprised between T0 and T0+ΔT, and the point p3 rises to a temperature T2 comprised between T0 and T0+ΔT, for example substantially equal to the temperature T1.

FIG. 5 illustrates a thermal resistor $R_{TH1}$ coupling the point p2 to the point p1, and a thermal resistor $R_{TH2}$ coupling the point p1 to the point p3. The association in series of the resistors $R_{TH1}$ and $R_{TH2}$ corresponds to the thermal resistor $R_{THNW}$ of the intermediate section $105c_{INT}$ of the wire 105c, between the nodes $105c_{INT-1}$ and $105c_{INT-2}$ of the wire 105c. The resistors $R_{TH1}$ and $R_{TH2}$ are, for example, each substantially equal to half the resistor $R_{THNW}$.

FIG. 5 further illustrates a thermal resistor $R_{TH3}$ that couples the node p2 to the anchoring area 105a, corresponding to the thermal resistance of the first lateral section of the wire 105c, extending between the end 105c-1 and the intermediate node $105c_{INT-1}$ of the wire, and a thermal resistor $R_{TH4}$ that couples the node p3 to the anchoring area 105b, corresponding to the thermal resistance of the second lateral section of the wire 105c, extending between the intermediate node $105c_{INT-2}$ and the end 105c-2 of the wire.

FIG. 5 additionally illustrates a thermal resistor $R_{TH5}$ that couples the node p2 to the anchoring area 209, and a thermal resistor $R_{TH6}$ that couples the node p3 to the anchoring area 211.

In order that the control devices 250 and 260 do not significantly alter the measured value, the electrical resistor $R_{LOAD}$ of the control circuit 260 should rather be relatively large before the electrical resistor $R_{NW}$ of the intermediate section $105c_{INT}$ of the semiconductor wire 105c, and the thermal resistors $R_{TH5}$ and $R_{TH6}$ of the semiconducting probe wires 201 and 203 should be relatively large before the thermal resistors $R_{TH3}$ and $R_{TH4}$ of the lateral sections of the semiconductor wire 105c.

For instance, the electrical resistor $R_{LOAD}$ of the voltage measurement device is chosen to be at least ten times greater, preferably at least a hundred times greater and even more preferably at least a thousand times greater, than the electrical resistor $R_{NW}$ of the intermediate section $105c_{INT}$ of the wire 105c. For instance, the electrical resistor $R_{LOAD}$ of the voltage measurement device is greater than 100 MΩ.

For instance, the thermal resistor $R_{TH5}$ of the semiconducting probe wire 201 is chosen to be greater, preferably at least twice as great, and even more preferably at least ten times greater than the thermal resistor $R_{TH3}$ of the first lateral section of the semiconductor wire 105c. Similarly, the resistor $R_{TH6}$ of the semiconducting probe wire 203 is chosen to be greater, preferably at least twice as great, and even more preferably at least ten times greater than the thermal resistor $R_{TH4}$ of the second lateral section of the semiconductor wire 105c.

In order to obtain the desired ratio between the thermal resistor $R_{TH5}$ and the thermal resistor $R_{TH3}$, the length of the wire 201 can be greater than the length of the first lateral section of the wire 105c (between the node p2 and the anchoring area 105a), and/or the width of the wire 201 can be less than the width of the first lateral section of the wire 105c. Similarly, in order to obtain the desired ratio between the thermal resistor $R_{TH6}$ and the thermal resistor $R_{TH4}$, the length of the wire 203 can be greater than the length of the second lateral section of the wire 105c (between the node p3 and the anchoring area 105b), and/or the width of the wire 203 can be less than the width of the second lateral section of the wire 105c.

Figure 6:
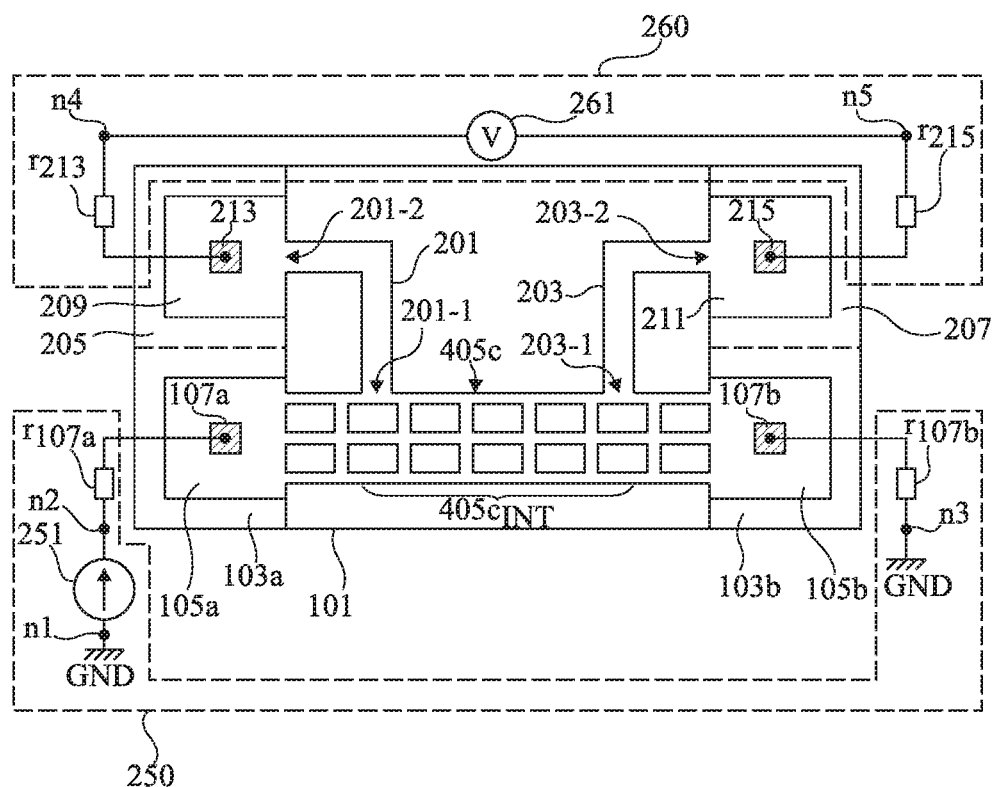
FIG. 6 is a top view depicting in a schematic fashion a further example embodiment of a measurement device comprising a suspended semiconductor wire.

FIG. 6 is a top view depicting in a schematic fashion a further example embodiment of a measurement device comprising a suspended semiconductor wire.

The device shown in FIG. 6 differs from the device shown in FIG. 2 mainly in that, in the device shown in FIG. 6, the semiconductor wire 105c is replaced by a lattice or a grid 405c with a generally elongated shape, constituted by a plurality of interconnected semiconductor wires, coupling the anchoring area 105a to the anchoring area 105b.

For instance, all the semiconductor wires constituting the grid 405c have substantially the same width. The grid 405c comprises, for example, a plurality of wires parallel to the upper face of the substrate 101 and parallel to the longitudinal axis of the grid, extending from the anchoring area 105a to the anchoring area 105b, and a plurality of wires parallel to the upper face of the substrate 101 and orthogonal to the longitudinal axis of the grid, coupling the longitudinal wires to one another.

In a similar manner to what has been described in the foregoing, the control circuit 250, connected on one side to the metallized contact 107a and on the other side to the metallized contact 107b, is adapted to apply and/or read an electrical signal between the two ends of the grid 405c, i.e. between the contact zone between the grid 405c and the anchoring area 105a, and the contact zone between the grid 405c and the anchoring area 105b. More specifically, in this example, the control circuit 250 is adapted to make an electric current flow between the two ends of the grid 405c.

In addition, in a similar manner to what has been described in the foregoing, the control circuit 260 is designed to apply and/or read a second electrical signal at the terminals of an intermediate section $405c_{INT}$ of the grid of semiconductor wires 405c. More specifically, in this example, the control circuit 260 is adapted to measure the voltage between the ends of the intermediate section $405c_{INT}$, by way of the semiconducting probe wires 201 and 203, of the anchoring areas 209 and 211, and of the metallized contacts 213 and 215.

In the embodiment shown in FIG. 6, each elementary wire of the grid 405c can have a transversal section with a smaller surface area than the semiconductor wire 105c of the example shown in FIG. 2, for example a transversal cross section of nanometric dimensions (for example less than 500 nm). An advantage is that it is possible by this means to amplify the phenomenon of self-heating of the semiconductor material as a result of the bias current, due to a reduced thermal conduction.

Figure 7:
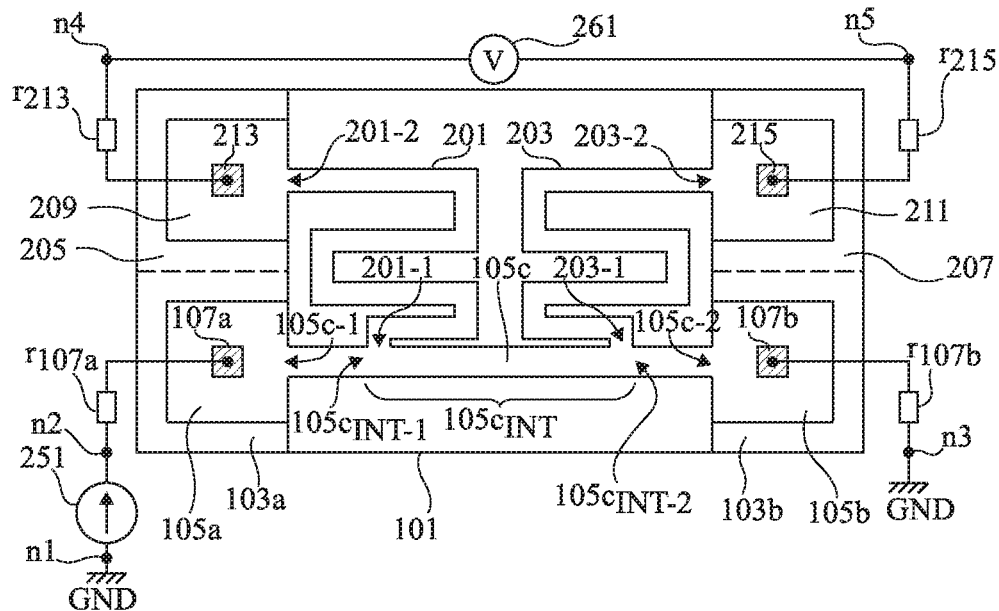
FIG. 7 is a top view depicting in a schematic fashion a further example embodiment of a measurement device comprising a suspended semiconductor wire.

FIG. 7 is a top view depicting in a schematic fashion a further example embodiment of a measurement device comprising a suspended semiconductor wire.

The device shown in FIG. 7 differs from the device shown in FIG. 2 mainly in that, in the device shown in FIG. 7, the semiconducting probe wires 201 and 203, coupling the ends of the intermediate section $105c_{INT}$ of the wire 105c to the voltage measurement circuit 261, have the shape of a coil, by which means it is possible to increase their length, and thus their thermal resistance, without increasing the total surface area of the device.

Figure 8:
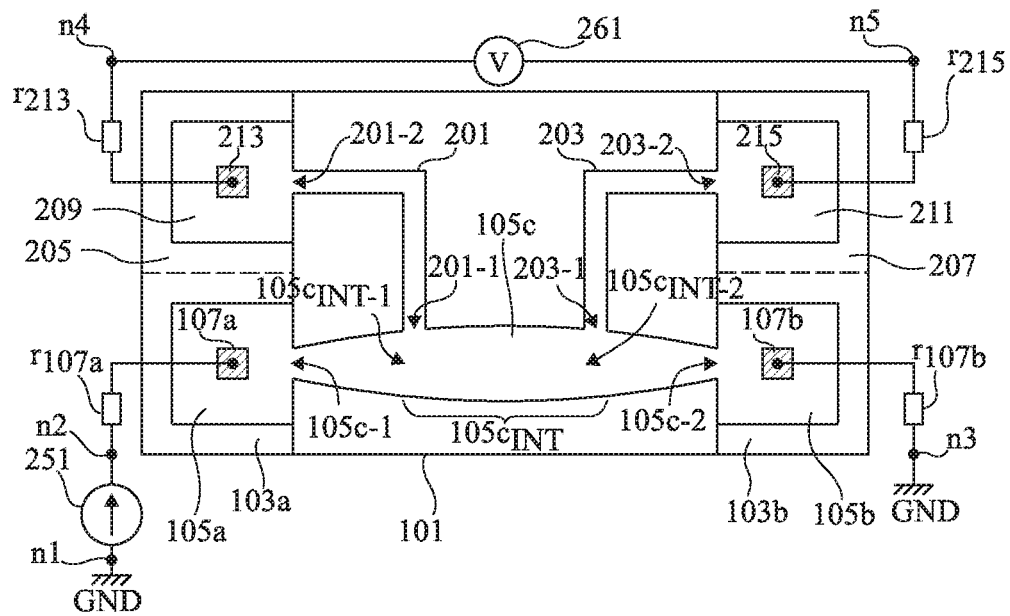
FIG. 8 is a top view depicting in a schematic fashion a further example embodiment of a measurement device comprising a suspended semiconductor wire.

FIG. 8 is a top view depicting in a schematic fashion a further example embodiment of a measurement device comprising a suspended semiconductor wire.

The device shown in FIG. 8 differs from the device shown in FIG. 2 mainly in that, in the device shown in FIG. 8, the semiconductor wire 105c has a non-uniform width along the longitudinal axis of the wire. More specifically, in the embodiment shown in FIG. 8, the width of the semiconductor wire 105c varies along the longitudinal axis of the wire so that, during operation, the temperature of the intermediate section $105c_{INT}$ of the wire is substantially uniform along its entire length. For this purpose, the width of the wire 105c gradually increases from the first end 105c-1 of the wire up to the center of the wire, then gradually decreases from the center of the wire up to the second end 105c-2 of the wire, for example in accordance with a parabolic profile.

An advantage of the embodiment shown in FIG. 8 is that the intermediate section $105c_{INT}$ of the wire 105c thus changes conduction regime simultaneously along its entire length as the result of a variation in the bias current and/or of a variation in the physical variable to be measured, which makes it possible to realize particularly precise measurements.

Figure 9:
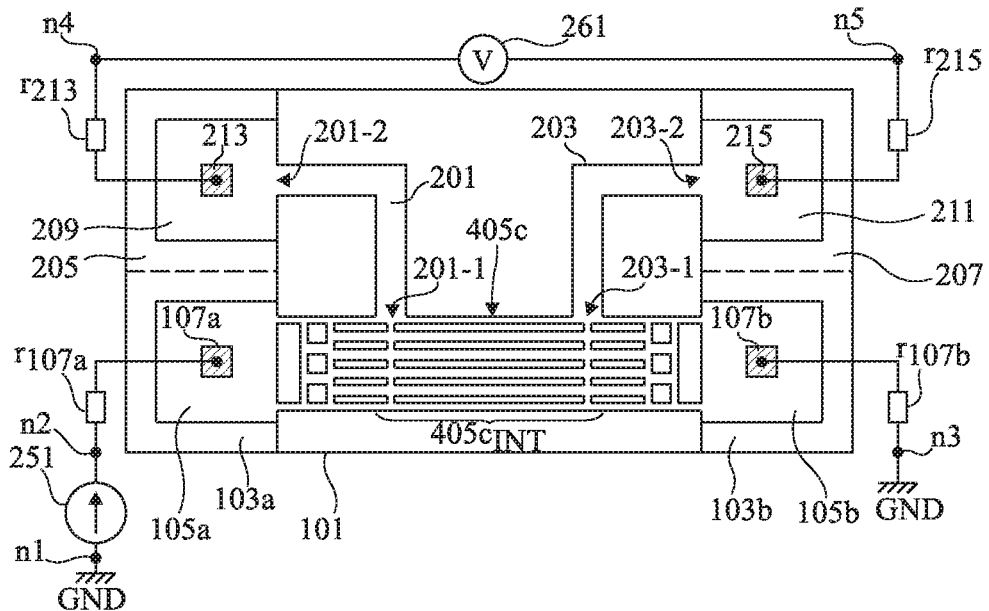
FIG. 9 is a top view depicting in a schematic fashion a further example embodiment of a measurement device comprising a suspended semiconductor wire.

FIG. 9 is a top view depicting in a schematic fashion a further example embodiment of a measurement device comprising a suspended semiconductor wire.

The device shown in FIG. 9 comprises elements in common with the device shown in FIG. 6, and differs from the device shown in FIG. 6 mainly in that, in the device shown in FIG. 9, the grid 405c of semiconductor wires has a total cross section for the passage of current that is not uniform along the longitudinal axis of the grid. More specifically, in the embodiment shown in FIG. 9, the density of semiconductor wires of the grid 405c varies along the longitudinal axis of the grid. By this means, in a similar manner to what has been described in the example shown in FIG. 8, it is possible to control the temperature profile of the intermediate section $405c_{INT}$ of the grid 405. For instance, the density of semiconductor wires of the grid 405c varies along the longitudinal axis of the grid 405c so that, during operation, the temperature of the intermediate section $405c_{INT}$ of the grid is substantially uniform along its entire length. For this purpose, in this example, the number of longitudinal semiconductor wires of the grid in the intermediate section $405c_{INT}$ is greater than the number of longitudinal semiconductor wires in the lateral sections of the grid.

Figure 10:
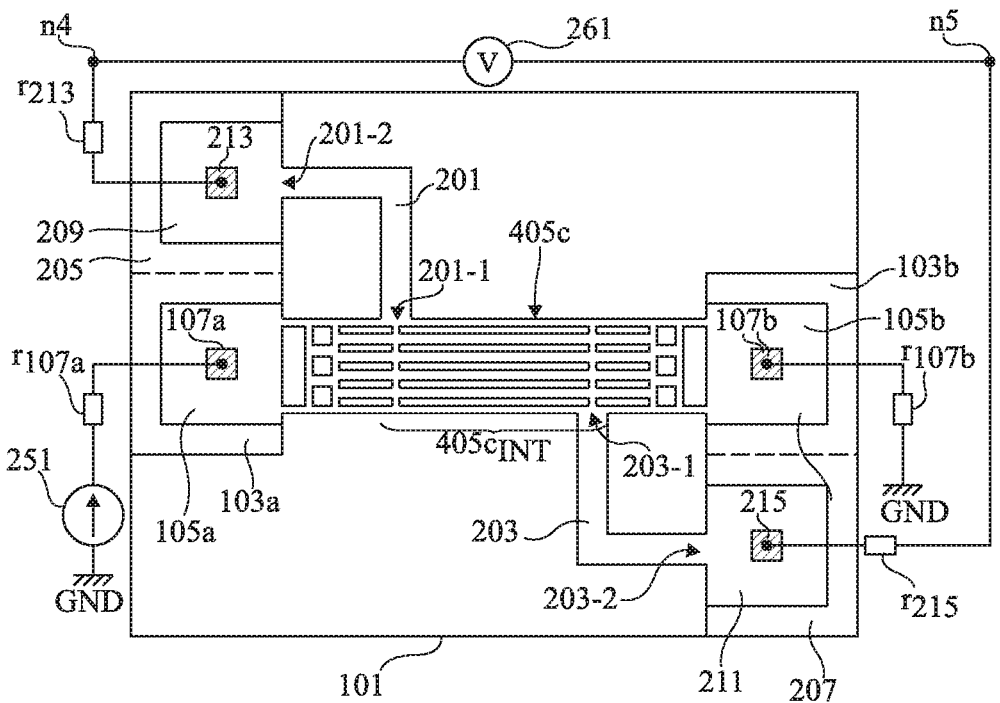
FIG. 10 is a top view depicting in a schematic fashion a further example embodiment of a measurement device comprising a suspended semiconductor wire.

FIG. 10 is a top view depicting in a schematic fashion a further example embodiment of a measurement device comprising a suspended semiconductor wire.

The device shown in FIG. 10 comprises elements in common with the device shown in FIG. 9, and differs from the device shown in FIG. 9 mainly in that, in the device shown in FIG. 10, the probe wires 201 and 203 are in contact with the opposite longitudinal edges of the semiconducting grid 405c, while, in the device shown in FIG. 9, the probe wires 201 and 203 are in contact with a same longitudinal edge of the semiconducting grid 405c.

An advantage of the measurement device shown in FIG. 10 compared to the measurement device shown in FIG. 9 is that it is possible by means of the device shown in FIG. 10 to probe the resistance of a larger part of the suspended structure than the device shown in FIG. 9. In the case of the device shown in FIG. 9, only the properties of the nanowire in contact with the probe wires 201, 203 are measured, it being understood that the properties of the nanowire in contact with the probe wires 201, 203 depend on the properties of the entirety of the structure.

In practice, the horizontal nanowires of the devices shown in FIGS. 9 and 10 can be coupled to one another by vertical nanowires. Preferably, as is evident in FIGS. 9 and 10, each of the probe wires 201, 203 is in contact with the structure 405c at a vertical nanowire of the structure 405c. By this means, it is possible to avoid or limit the appearance of a voltage or temperature differential, in the vertical direction (or direction orthogonal to the longitudinal axis of the structure 405c), at the contact zone for the voltage measurement.

Figure 11:
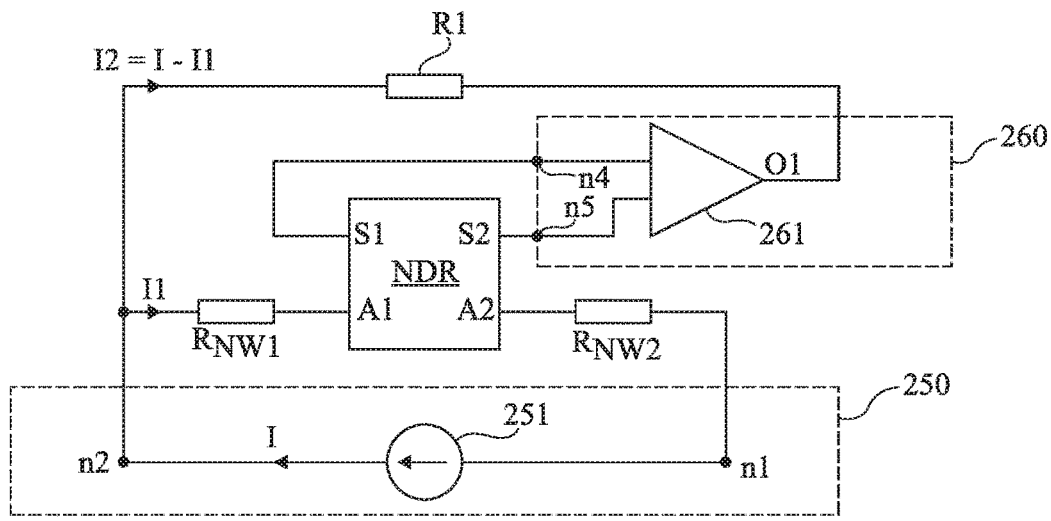
FIG. 11 is a simplified circuit diagram of an example embodiment of a measurement device comprising a suspended semiconductor wire.

FIG. 11 is a simplified circuit diagram of an example embodiment of a measurement device comprising a suspended semiconductor wire. For example, a measurement device of the type described in relation to FIG. 2 is considered here, comprising a first control circuit 250 connected to the ends of the suspended semiconductor wire and adapted to apply a bias current through the wire, and a second control circuit 260 designed to measure a voltage at the terminals of a central section of the wire, located between the first and second ends of the wire. Provided in this example is more specifically an exploitation of the conduction regime change in the intermediate section of the wire for effecting a measurement of a physical variable characteristic of the environment of the wire.

In FIG. 11, the central section of the suspended semiconductor wire is illustrated in the form of a block NDR comprising two terminals A1 and A2 via which the bias current I1 of the central section of the wire is applied (the terminals A1 and A2 corresponding, for example, respectively to the intermediate nodes $105c_{INT-1}$ and $105c_{INT-2}$ in the example shown in FIG. 2), and two terminals S1 and S2 to which the control circuit 260 that measures the voltage at the terminals of the central section of the wire is connected (the terminals S1 and S2 respectively corresponding, for example, to the metallized contacts 213 and 215 in the example shown in FIG. 2). FIG. 11 further illustrates electrical resistors $R_{NW1}$ and $R_{NW2}$ respectively corresponding to the lateral sections of the semiconductor wire (respectively between the metallized contact 107a and the intermediate node $105c_{INT-1}$ and between the metallized contact 107b and the intermediate node $105c_{INT-2}$ in the example shown in FIG. 2).

For the sake of simplification, the access resistors r107a and r107b of the control circuit 250 and the access resistors r213 and r215 of the control circuit 260 have not been illustrated in FIG. 11.

In the example shown in FIG. 11, the control circuit 250 comprises a current source 251 having a first conduction terminal connected to a node n1 of the circuit 250 and a second conduction terminal connected to a node n2 of the circuit 250. In this example, the node n1 is coupled to a first end of the resistor $R_{NW2}$ (potentially via the access resistor r107b, not illustrated in FIG. 11), the second end of the resistor $R_{NW2}$ being connected to the terminal A2 of the block NDR. Additionally, in this example, the node n2 is coupled to a first end of the resistor $R_{NW1}$ (potentially via the access resistor r107a, not illustrated in FIG. 11), the second end of the resistor $R_{NW1}$ being connected to the terminal A1.

In the example shown in FIG. 11, the control circuit 260 comprises a voltage measurement amplifier 261 having a first measurement terminal n4 coupled to the terminal S1 of the block NDR (potentially via the access resistor r213 not illustrated in FIG. 11), and a second measurement terminal n5 coupled to the terminal S2 of the block NDR (potentially via the access resistor r215 not illustrated in FIG. 11). The measurement amplifier 261 comprises an outlet O1 that provides an outlet voltage $V=V_{S2}-V_{S1}$, where $V_{S2}$ and $V_{S1}$ respectively designate the voltage (referenced with respect to ground) on the terminal S2 of the block NDR and the voltage (referenced with respect to ground) on the terminal S1 of the block NDR. It should be noted that the voltage measurement amplifier 261 in this example is unity-gain amplifier. However, the measurement device shown in FIG. 11 can be adapted to use a measurement amplifier with a voltage gain different from 1. Preferably, the voltage measurement amplifier 261 has a large input impedance so as to avoid significantly modifying the drop in measured voltage.

The measurement device shown in FIG. 11 further comprises an electrical resistor R1 having a first end coupled, for example connected, to the outlet O1 of the measurement amplifier 261, and a second end coupled, for example connected, to the end of the resistor $R_{NW1}$ opposite the terminal A1 (for example to the metallized contact 107a in the example shown in FIG. 2).

During operation, the control circuit 250 is controlled so that the current source 251 imposes a given current I between its conduction nodes n1 and n2. A part I1 of the current I is deviated from the semiconductor wire. The current I1 constitutes the bias current of the semiconductor wire. The rest of the current I, i.e. a current I2=I-I1, is deviated by the feedback resistor R1 of the measurement device. In practice, the current I2, and thus the current I1=I-I2, depend on the value of the voltage $V=V_{S2}-V_{S1}$ on the output terminal O1 of the measurement amplifier 261.

Figure 12:
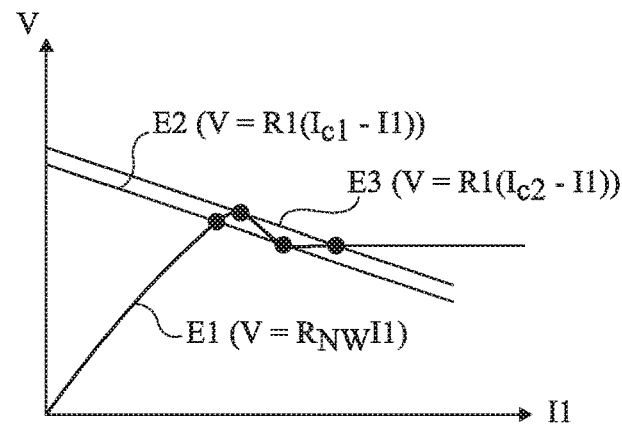
FIGS. 12, 13 and 14 are graphs depicting the operation of the measurement device shown in FIG. 11.
Figure 13:
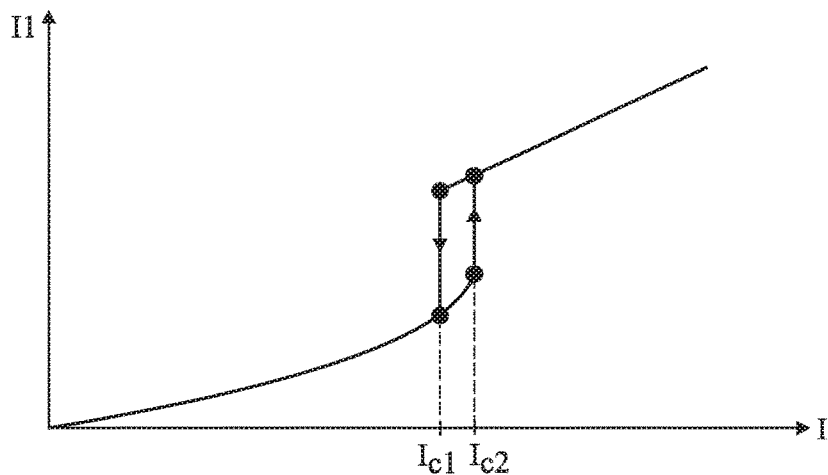
Figure 14:
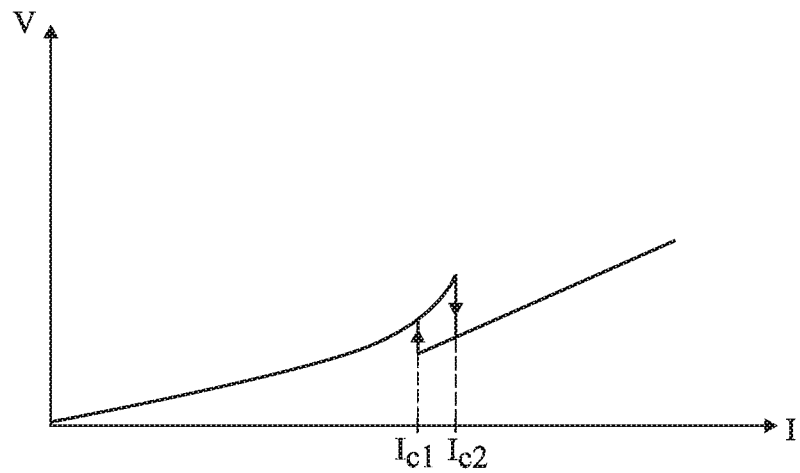

FIGS. 12, 13 and 14 are graphs depicting the behavior of the measurement device shown in FIG. 11.

FIG. 12 comprises a curve E1 representing the progression, as a function of the current I1 (in the abscissa) of the voltage V (in the ordinate) at the terminals of the central section NDR of the semiconductor wire of the device, as a function of the bias current I1 flowing in the semiconductor wire. As is evident in FIG. 12, the curve E1 is non-monotonic due to the conduction regime change in the semiconductor wire, which confers upon the central section NDR of the wire a characteristic of negative differential resistance. More specifically, the curve E1 is a continuous curve comprising a phase of growth, followed by a phase of decline, then another phase of growth.

FIG. 12 further comprises a straight line E2 representing, for a given bias current $I=I_{c1}$ provided by the current source 251, the progression, as a function of the current I1, of the voltage $V=R1*(I_{c1}-I1)$ at the terminals of the resistor R1.

FIG. 12 additionally comprises a straight line E3 representing, for a given bias current $I=I_{c2}$ provided by the current source 251, with $I_{c2}>I_{c1}$, the progression, as a function of the current I1, of the voltage $V=R1*(I_{c2}-I1)$ at the terminals of the resistor R1.

As is evident from FIG. 12, each of the straight lines E2 and E3 intersects the curve E1 at two points. In other words, for each of the bias currents $I=I_{c1}$ and $I=I_{c2}$ of the measurement device, there are two possible stable bias states of the device, i.e. the current I1 flowing in the semiconductor wire can have one or the other of two stable values, respectively corresponding to two values separate from the voltage V at the terminals of the central section of the semiconductor wire. More generally, regardless of the value of the bias current I between the values $I_{c1}$ and $I_{c2}$, there are two stable bias states of the device.

One can further observe in FIG. 12 that the current $I=I_{c1}$ corresponds to the smallest bias current of the device at which the device has two stable bias states. Indeed, for a bias current $I<I_{c1}$, there is a single intersection of the curve E1 with the straight line of the equation V=R1(I-I1), and thus a single stable bias state of the device. In addition, the current $I=I_{c2}$ corresponds to the strongest bias current of the device at which the device has two stable bias states. Indeed, for a bias current $I>I_{c2}$, there is a single intersection of the curve E1 with the straight line of the equation V=R1(I-I1), and thus a single stable bias state of the device.

Thus, there is a value range [$I_{c1}$, $I_{c2}$] of the bias current I in which two bias states of the device are possible, corresponding to two different distributions of the current I between the suspended semiconductor wire and the resistor R1. The measurement device shown in FIG. 11 thus has a bistable behavior and its response in current has a hysteresis, as FIG. 13 illustrates.

FIG. 13 is a graph illustrating the progression, as a function of the bias current I of the measurement device (in the abscissa), of the current I1 (in the ordinate) flowing in the suspended semiconductor wire.

One observes in FIG. 13 that, when the current I increases from a value lower than the threshold value $I_{c1}$, the current I1 increases in a continuous manner with the current I, until the current I reaches the high threshold value $I_{c2}$. When the current I crosses the threshold $I_{c2}$, the current I1 increases abruptly, because of a change in distribution of the current I between the suspended semiconductor wire and the resistor R1. The current I1 then continues to increase in a continuous manner as a function of the current I.

When the current I decreases from a value greater than the threshold value $I_{c2}$, the current I1 decreases in a continuous manner with the current I, until the current I reaches the low threshold value Ic1. When the current I crosses the threshold $I_{c1}$, the current I1 drops abruptly, because of a change in distribution of the current I between the suspended semiconductor wire and the resistor R1.

FIG. 14 is a graph similar to the graph shown in FIG. 13, illustrating the progression, as a function of the bias current I of the measurement device (in the abscissa), of the voltage V (in the ordinate) as the output of the measurement amplifier 261 of the device shown in FIG. 11.

One observes in FIG. 14 that, when the current I increases from a value lower than the threshold value $I_{c1}$, the voltage V increases in a continuous manner with the current I, until the current I reaches the high threshold value $I_{c2}$. When the voltage V crosses the threshold $I_{c2}$, the voltage V drops abruptly, because of a change in distribution of the current I between the suspended semiconductor wire and the resistor R1. Indeed, as explained in the foregoing in relation to FIG. 13, when the current I crosses the threshold $I_{c2}$, the current I1 flowing in the suspended semiconductor wire increases abruptly, which causes a significant heating of the wire, leading to a conduction regime change in the wire. More specifically, the suspended semiconductor wire moves from the extrinsic conduction regime to the intrinsic conduction regime, which causes an abrupt drop in the electrical resistance of the central section of the suspended semiconductor wire, and thus a drop in the voltage V. The voltage V then continues to increase in a continuous manner as a function of the current I.

When the current I decreases from a value greater than the threshold value $I_{c2}$, the voltage V decreases in a continuous manner with the current I, until the current I reaches the low threshold value $I_{c1}$. When the voltage V crosses the threshold $I_{c1}$, the voltage V increases abruptly, because of the change in distribution of the current I between the suspended semiconductor wire and the resistor R1. Indeed, as explained in the foregoing in relation to FIG. 13, when the current I crosses the threshold $I_{c1}$, the current I1 flowing in the suspended semiconductor wire drops abruptly, which causes a cooling of the wire, leading to a conduction regime change in the wire. More specifically, the suspended semiconductor wire moves from the intrinsic conduction regime to the extrinsic conduction regime, which causes an abrupt increase in the electrical resistance of the central section of the suspended semiconductor wire, and thus an increase in the voltage V. The voltage V then continues to decrease in a continuous manner as a function of the current I.

Figure 15:
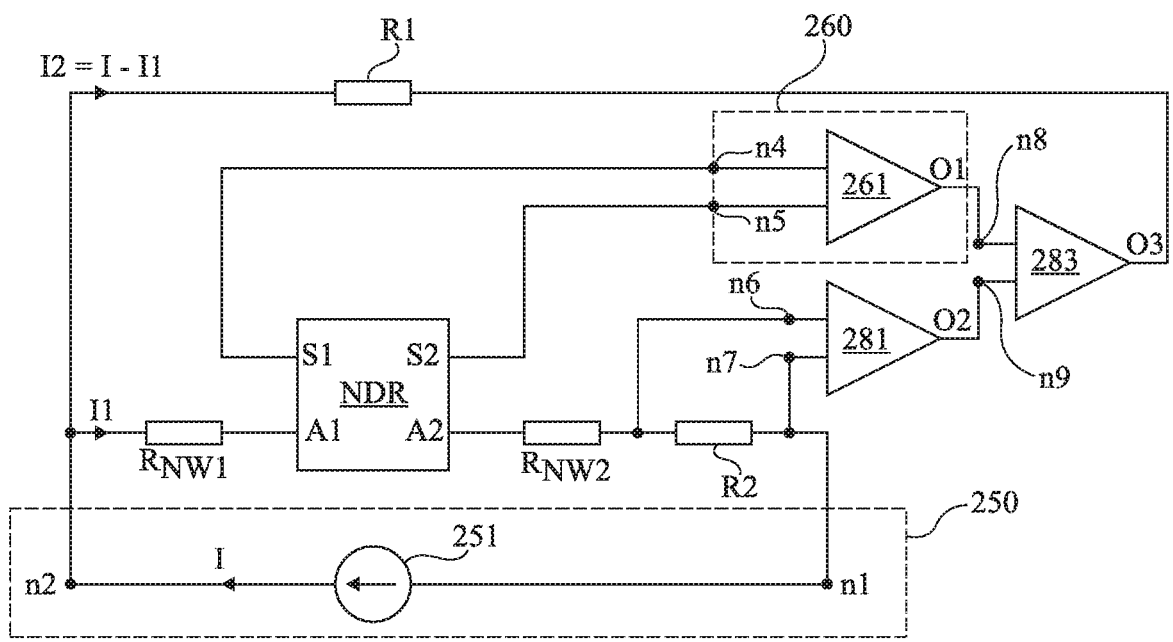
FIG. 15 is a simplified circuit diagram of a further example embodiment of a measurement device comprising a suspended semiconductor wire.

The device shown in FIG. 15 comprises the same elements as the device shown in FIG. 11, substantially designed in the same manner, and further comprises an additional electrical resistor R2, an additional voltage measurement amplifier 281, and a non-inverting voltage adder 283. The resistor R2 is connected in series with the resistor $R_{NW2}$ between the terminal A2 and the node n1. More specifically, the resistor R2 has a first end coupled, for example connected, to the node n1, and a second end coupled, for example connected, to the end of the resistor $R_{NW2}$ opposite the terminal A2. The measurement amplifier 281 has a first measurement terminal n6 coupled, for example connected, to the middle point between the resistors $R_{NW2}$ and R2, and a second measurement terminal coupled, for example connected, to the end of the resistor R2 opposite the resistor $R_{NW2}$. The adder 283, in turn, has a first input terminal n8 coupled, for example connected, to the outlet O1 of the amplifier 261, and a second input terminal n9 coupled, for example connected, to an output terminal O2 of the measurement amplifier 281. In this example, the resistor R1 couples the node n2, not to the output terminal O1 of the measurement amplifier 261, but to an output terminal O3 of the adder 283.

Figure 16:
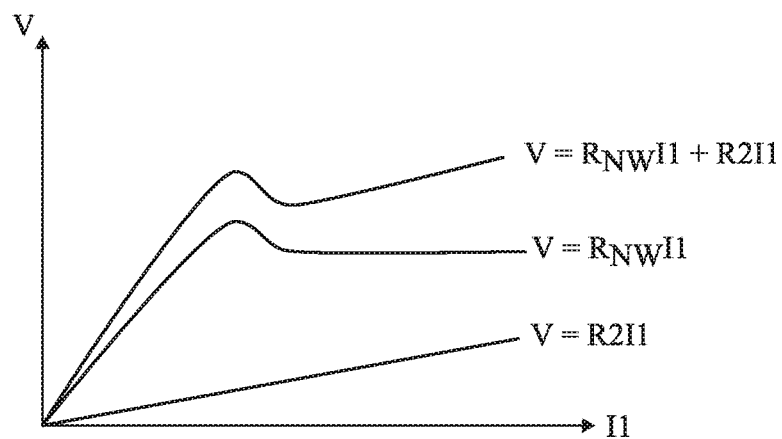
FIG. 16 is a graph depicting the operation of the measurement device shown in FIG. 15.

One thus obtains, as FIG. 16 illustrates, an improved characteristic V(I) for which the jump in current in the suspended semiconductor wire is lower when the current I exceeds the threshold $I_{c2}$, which makes it possible to limit the current range in the semiconductor wire, and consequently the heating of the structure.

An example embodiment of the measurement devices of FIGS. 11 and 15 will now be described.

Again with reference to FIG. 14, the limits $I_{c1}$ and $I_{c2}$ of the range of bias current I for which there are two possible bias states of the current measurement device depend on the characteristic $V=R_{NW}I1$ of the voltage at the terminals of the intermediate section of the semiconductor wire, and thus depend in a non-trivial manner on the value of the resistor $R_{NW}$ and on the temperature. A change in the thermal exchanges with the surrounding area, for example linked to a change in pressure or in the nature of the surrounding gas, thus induces a modification of the threshold values $I_{c1}$ and $I_{c2}$ of the bias current I. Similarly, a change in the resistor $R_{NW}$ linked to a parameter other than temperature, for example via a piezoresistive effect, causes a modification of the threshold values $I_{c1}$ and $I_{c2}$. The values $I_{c1}$ and $I_{c2}$ further depend on the electrical parameters of the circuit, and in particular on the value of the resistor R1 and, if applicable, of the resistor R2, as well as on the gain of the measurement amplifier 261 and, if applicable, on the measurement amplifier 281.

The operation of a sensor according to an example of an embodiment is based on the fact that a variation in the physical variable that one desires to measure causes a modification of the threshold values $I_{c1}$ and/or $I_{c2}$ of the bias current I, i.e. a modification of the limits of the range of the bias current I for which there are two possible stable bias states of the device.

A variation in the physical variable to be measured that is capable of causing a modification of the thresholds $I_{c1}$ and/or $I_{c2}$ is called a disturbance here, it being understood that it is desired here to detect an occurrence of such a disturbance.

The bias current I of the device, induced by the current source 251, is chosen so that the voltage V at the terminals of the central section of the suspended semiconductor wire (between the terminals S1 and S2 with the notations shown in FIG. 11) exhibits a jump (abrupt change in value) in the presence of the disturbance.

Figure 17:
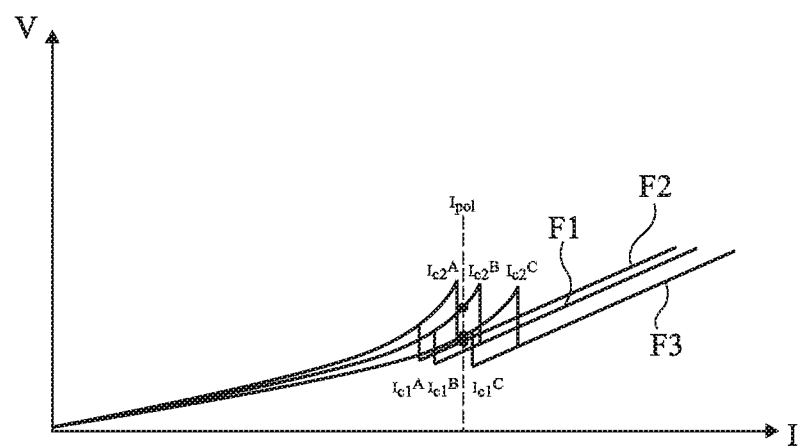
FIG. 17 is a graph depicting the operation of an example embodiment of a measurement device comprising a suspended semiconductor wire.

FIG. 17 more specifically illustrates the choice of the bias current I and the operation of the sensor.

The current I is fixed at a value $I=I_{pol}$ comprised between values $I_{c1}^B$ and $I_{c2}^B$, $I_{c1}^B$ and $I_{c2}^B$ respectively designating the threshold value $I_{c1}$ and the threshold value $I_{c2}$ in the absence of a disturbance (curve F1 shown in FIG. 17). For instance, the value $I=I_{pol}$ is chosen to be substantially equal to $(I_{c1}^B+I_{c2}^B)/2$.

In the presence of a disturbance that leads to a lowering of the high threshold $I_{c2}$ from the value $I_{c2}^B$ to a value $I_{c2}^A$ lower than $I_{c2}^B$, and a lowering of the low threshold $I_{c1}$ from the value $I_{c1}^B$ to a value $I_{c1}^A$ lower than $I_{c1}^B$, with $I_{c2}^A<I_{pol}$ (curve F2 shown in FIG. 17), an abrupt decrease in the voltage V at the terminals of the central section of the suspended semiconductor wire is observed (linked to the change of branch of the point of operation on the curve V(I)), which makes it possible to detect the disturbance efficiently.

It should be noted that, in order to be able to detect a disturbance efficiently, the disturbance should cause a branch change in the hysteresis curve V(I) of the device. For example, if the disturbance leads to a raising of the high threshold $I_{c2}$ from the value $I_{c2}^B$ to a value $I_{c2}^C$ greater than $I_{c2}^B$, and a raising of the low threshold $I_{c1}$ from the value $I_{c1}^B$ to a value $I_{c1}^C$ greater than $I_{c1}^B$, with $I_{c1}^C>I_{pol}$ (curve F3 shown in FIG. 17), there is no branch change of the point of operation on the curve V(I), and thus no abrupt jump in the voltage V.

Thus, the disturbance limit value leading to a jump in the voltage V depends on the initial conditions, on the value $I_{pol}$ of the bias current, and on the values of the parameters R1 and, if applicable, R2.

The jump in the voltage V at the terminals of the central section of the suspended semiconductor wire can be used to perform a detection of the crossing of a threshold by the physical variable to be measured, it being understood that the threshold can be adjusted in a dynamic manner by playing with the value of the bias current I.

In a particularly advantageous embodiment, the control circuit 250 is controlled in order to make the bias current I vary in a continuous manner, for example in a periodic manner, for example in a sinusoidal manner, so as to scan the three operating ranges depicted in FIG. 17. More specifically, the control circuit 250 can be controlled in order to make the bias current I vary in a periodic manner, so that, at each cycle, the current I increases from a low value lower than the smallest value that the threshold $I_{c1}$ can have in normal conditions of use of the device, until a high value greater than the largest value that the threshold $I_{c2}$ can have in normal conditions of use of the device, then decreases from said high value to said low value. The value of the current I for which a jump in the voltage V at the terminals of the central section of the suspended semiconductor wire is observed is thus representative of the physical variable to be measured. Thus, at each period of the bias current I, a measurement of the physical variable can be carried out. It is thus possible to carry out a periodic sampling of the physical variable to be measured, at a sampling frequency equal to the frequency of the bias signal I. The suspended semiconductor wire devices have the advantage of having a very low thermal inertia, which makes it possible to carry out a sampling at a relatively high frequency, for example greater than 1 kHz, for example comprised between 1 kHz and 100 kHz.

Figure 18:
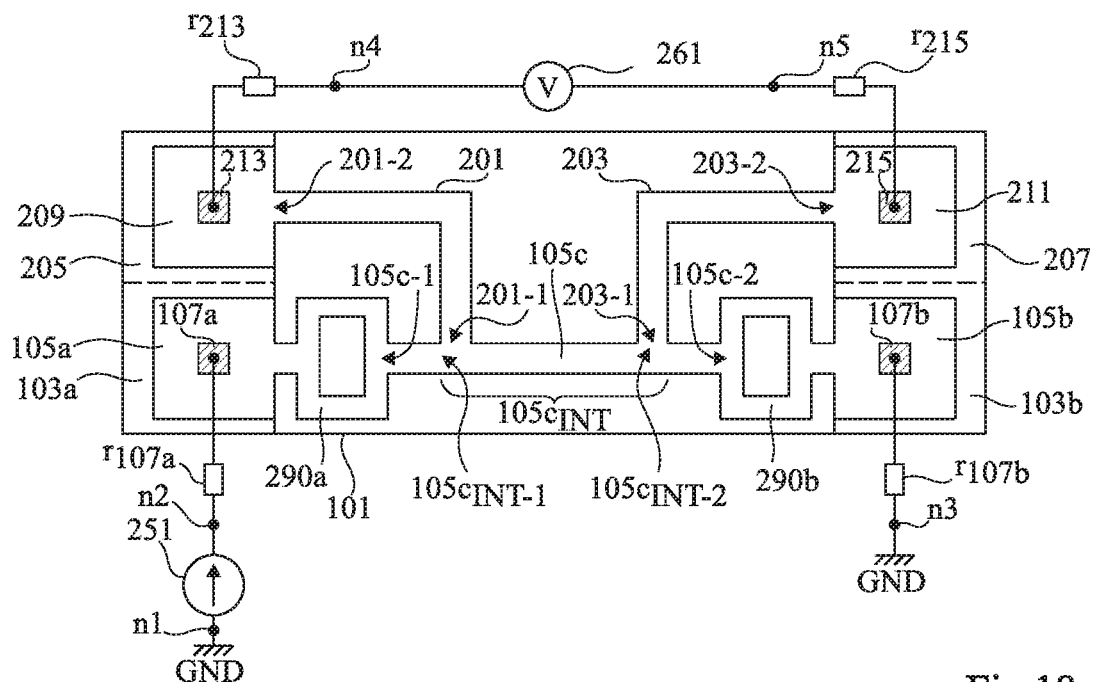
FIG. 18 is a top view depicting in a schematic fashion a further example embodiment of a measurement device comprising a suspended semiconductor wire.

FIG. 18 is a top view depicting in a schematic fashion a further example embodiment of a measurement device comprising a suspended semiconductor wire.

The device shown in FIG. 18 differs from the device shown in FIG. 2 mainly in that, in the device shown in FIG. 18, the ends 105c-1 and 105c-2 of the suspended semiconductor wire are not directly coupled to the anchoring areas 105a and 105b of the device as in the example shown in FIG. 2, but by way of deformable suspended structures 290a and 290b, adapted to absorb potential variations in the length of the wire 105c as a result of the temperature variations. More specifically, the structure 290a couples the end 105c-1 of the wire 105c to the anchoring area 103a, and the structure 290b couples the end 105c-2 of the wire 105c to the anchoring area 103b. The structures 290a and 290b are, for example, realized from the same material as the semiconductor wire 105c. In the illustrated example, the structures 290a and 290b each have, when viewed from above, the form of a ring having an outer edge fixed to an end of the wire 105c and an opposite outer edge fixed to the anchoring area 105a, respectively 105b. More generally, the deformable structures 290a and 290b can have any other form that is adapted to deform when the length of the semiconductor wire 105c varies as a result of the temperature variations. By means of the deformable structures 290a and 290b, it is possible for the semiconductor wire 105c to expand when the temperature varies, thus limiting the appearance of stresses in the wire, and thus the parasitic variations in the resistance of the wire by piezoresistive effect. This embodiment is in particular advantageous when the device is used for the characterization of the properties of high-temperature suspended semiconductor wires.

FIGS. 19A, 19B, 19C, 19D, 19E, 19F, 19G and 19H are sectional views depicting in a schematic fashion successive steps of an example of a method for manufacturing a measurement device comprising a suspended semiconductor wire of the type described above.

Figure 19A:
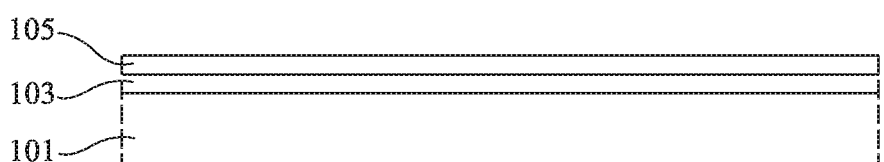
FIGS. 19A, 19B, 19C, 19D, 19E, 19F, 19G and 19H are sectional views depicting in a schematic fashion successive steps of an example of a method for manufacturing a measurement device comprising a suspended semiconductor wire.

FIG. 19A depicts a starting structure comprising a support substrate 101, for example made of a semiconductor material, a layer 103, for example made of an insulating material, substantially covering the entire upper face of the substrate 101, and a layer 105 made of a semiconductor material substantially covering the entire upper face of the layer 103. For instance, the starting structure is a stack of the SOI type (semiconductor on insulator), the layer 101 constituting the support substrate of the stack, for example made of silicon, the layer 103 corresponding to the insulating layer of the stack, for example made of silicon oxide, and the layer 105 corresponding to the upper semiconducting layer of the stack, for example made of unintentionally doped single crystal silicon.

Figure 19B:
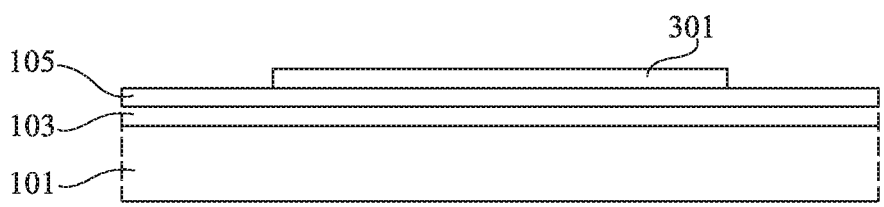
Figure 19C:
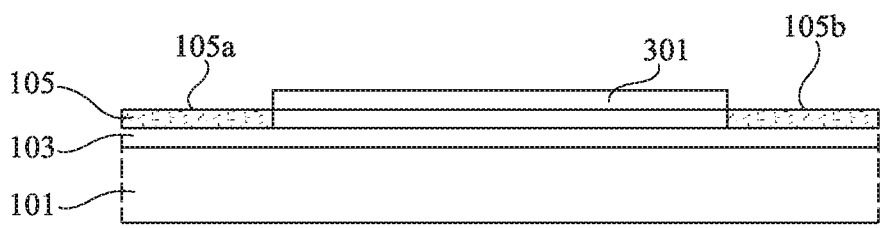
Figure 19D:
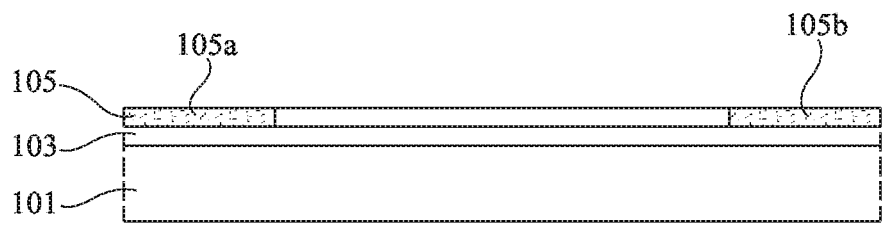

FIGS. 19B, 19C and 19D depict a step of localized doping, for example by implantation, of portions of the upper semiconducting layer 105 of the stack. For this purpose, a mask 301 is first realized on the upper face of the semiconducting layer 105, for example by photolithography and etching (FIG. 19B). For instance, the mask 301 is made of silicon oxide and has a thickness comprised between 50 and 100 nm. The mask 301 comprises openings across from areas of the semiconducting layer 105 that one wishes to dope. A step of implantation of doping elements from the upper face of the structure is then implemented, the mask 301 making it possible to localize the doping in the desired areas (FIG. 19C). More specifically, in this example, the portions of the layer 105 corresponding to the future anchoring areas of the one or more suspended semiconductor wires are doped in order to facilitate the establishment of an electric contact on these areas (via the metallized contacts 107a, 107b, 213, 215). In this example, the portions of the layer 105 corresponding to the one or more future suspended semiconductor wires are, however, not doped during this step. In FIG. 19C, only the anchoring areas 105a and 105b have been illustrated. The mask 301 is then removed (FIG. 19D). A step of implantation annealing can further be provided after the removal of the mask 301, for example at a temperature comprised between 1000° C. and 1100° C., during a duration comprised between 30 and 90 minutes.

Figure 19E:
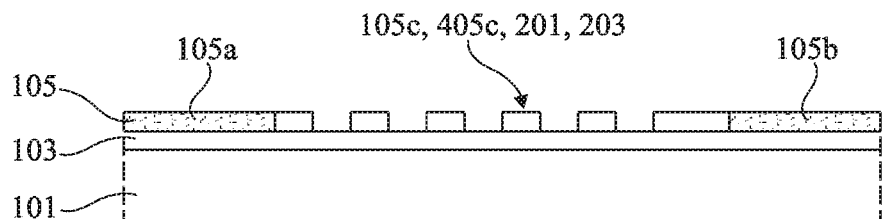

FIG. 19E depicts a step of localized etching of the semiconducting layer 105, for example by photolithography and etching, in order to delimit the anchoring areas and the one or more suspended semiconductor wires of the device. During this step, the etched portions of the layer 105 are removed along the entire thickness of the layer 105, the etching stopping on the upper face of the layer 103. It should be noted that the etching pattern shown in FIG. 19E is purely illustrative.

Figure 19F:
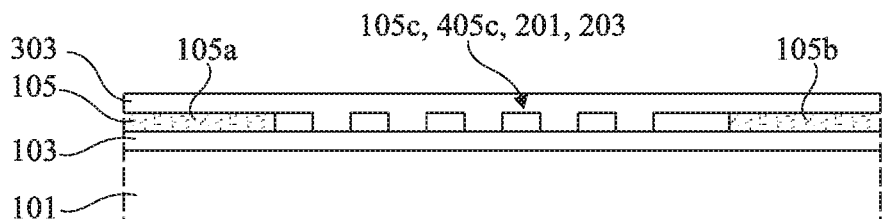
Figure 19G:
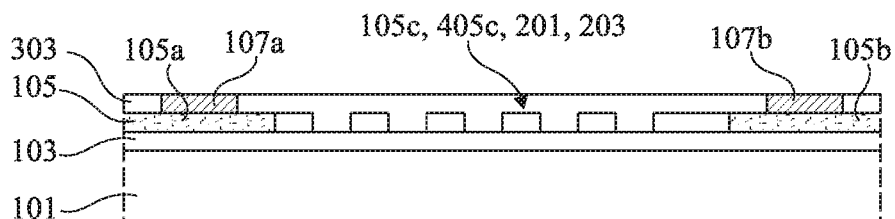
Figure 19H:
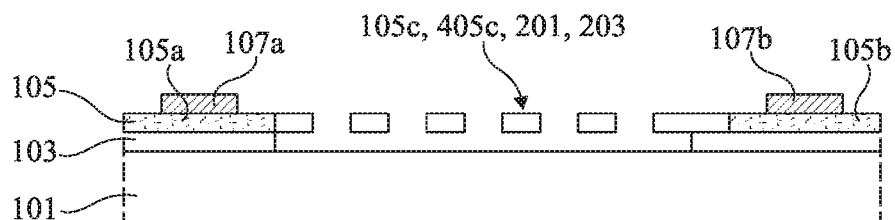

FIG. 19F depicts a step of depositing a layer 303 made of an insulating material, for example a layer of silicon oxide along the entire upper surface of the structure obtained at the end of the steps shown in FIGS. 19A to 19E.

FIG. 19E depicts a step of etching localized openings in the layer 303, across from the anchoring areas 105a, 105b, 209 and 211, for example by photolithography and etching, then of depositing an electrically conductive material, for example aluminum, in the openings, in order to form the contact terminals 107a, 107b, 213 and 215 of the device. In FIG. 19E, only the metallized contacts 107a and 107b have been illustrated.

FIG. 19F depicts a step of removing the layers 103 and 303, for example by vapor-phase chemical etching, for example hydrofluoric acid vapor etching, so as to free the one or more suspended semiconductor wires.

Particular embodiments have been described. Various variants and modifications will occur to those skilled in the art. in particular, the described embodiments are not limited to the example structure patterns of suspended semiconductor wires mentioned in the present disclosure and illustrated in the figures.

In addition, the described embodiments are not limited to the examples of materials mentioned in the present disclosure.

What is claimed is:

1. A measurement device comprising:
a suspended semiconductor wire;
a first control circuit designed to apply and/or read a first electrical signal between first and second ends of the suspended semiconductor wire;
a second control circuit designed to apply and/or read a second electrical signal between first and second intermediate nodes of the suspended semiconductor wire;
a first probe wire made of a semiconductor material, coupling the first intermediate node of the suspended semiconductor wire to a third conductive terminal; and
a second probe wire made of a semiconductor material, coupling the second intermediate node of the suspended semiconductor wire to a fourth conductive terminal;

wherein the first control circuit is configured to apply a bias current between the first and second ends of the suspended semiconductor wire, wherein the second control circuit is connected to the third and fourth conductive terminals and configured to measure the voltage between the first and second intermediate nodes of the suspended semiconductor wire, and wherein the first probe wire has a thermal resistance greater than a thermal resistance of a first lateral section of the suspended semiconductor wire extending between the first end of the suspended semiconductor wire and the first intermediate node of the suspended semiconductor wire, and wherein the second probe wire has a thermal resistance greater than a thermal resistance of a second lateral section of the suspended semiconductor wire extending between the second end of the suspended semiconductor wire and the second intermediate node of the suspended semiconductor wire.

2. The measurement device according to claim 1, wherein the first and second ends of the suspended semiconductor wire are respectively fixed to first and second semiconducting anchoring areas, the device comprising a first conductive terminal on and in contact with the first anchoring area and a second conductive terminal on and in contact with the second anchoring area, and the first control circuit being connected to the first and second conductive terminals.

3. The measurement device according to claim 2, wherein the first and second anchoring areas respectively lie on first and second support pillars.

4. The measurement device according to claim 1, wherein: the first probe wire has a first end fixed to the first suspended semiconductor wire at its first intermediate node and a second end fixed to a third semiconducting anchoring area; the second probe wire has a first end fixed to the first suspended semiconductor wire at its second intermediate node and a second end fixed to a fourth semiconducting anchoring area: and the third and fourth conductive terminals are respectively on and in contact with the third anchoring area and on and in contact with the fourth anchoring area.

5. The measurement device according to claim 4, wherein the third and fourth anchoring areas respectively lie on third and fourth support pillars so that the first probe wire is suspended between the third support pillar and the first intermediate node of the suspended semiconductor wire and so that the second probe wire is suspended between the fourth support pillar and the second intermediate node of the suspended semiconductor wire.

6. The device according to claim 1, wherein the width of the first suspended semiconductor wire varies along the longitudinal axis of the wire so that, during operation, the temperature between the first and second intermediate nodes of the suspended semiconductor wire is substantially uniform.

7. The measurement device according to claim 1, comprising a plurality of suspended semiconductor wires that are interconnected so as to form a suspended semiconducting grid.

8. The device according to claim 7, wherein the density of suspended semiconductor wires of the grid varies along a longitudinal axis of the grid.

9. The measurement device according to claim 1, wherein the second measurement circuit comprises a first voltage measurement amplifier having a first measurement terminal coupled to the first intermediate node of the suspended semiconductor wire and a second measurement terminal coupled to the second intermediate node of the suspended semiconductor wire, the first voltage measurement amplifier further comprising an output terminal coupled to the first end of the suspended semiconductor wire by a first resistor.

10. The measurement device according to claim 9, further comprising a second voltage measurement amplifier and a voltage adder, wherein:

the second voltage measurement amplifier has first (n6) and second measurement terminals respectively coupled to first and second ends of a second resistor connected in series with the suspended semiconductor wire;

the voltage adder has first and second input terminals respectively coupled to the output terminal of the first amplifier and to an output terminal of the second amplifier; and the voltage adder comprises an output terminal coupled to the first end of the suspended semiconductor wire by the first resistor.

11. The measurement device according to claim 9, wherein, during operation, a first part of the bias current flows in the suspended semiconductor wire and a second part of the bias current is deviated by the first resistor, the values of the first and second parts of the bias current being dependent on the value of the voltage on the end of the first resistor opposite the first end of the suspended semiconductor wire.

12. The measurement device according to claim 11, wherein the bias current provided by the first control circuit is chosen so that there are two stable bias states of the device, i.e. two possible distributions of the bias current between the suspended semiconductor wire and the first resistor.

13. The measurement device according to claim 12, wherein the second control circuit is configured to detect an abrupt change in the bias state of the device, corresponding to a crossing of a threshold by a physical variable characteristic of the environment of the semiconductor wire.

14. The measurement device according to claim 1, wherein the first control circuit is configured to provide a periodically variable bias current.

* * * * *